US012641796B2

(12) United States Patent
Zhu

(10) Patent No.: US 12,641,796 B2
(45) Date of Patent: May 26, 2026

(54) NOR-TYPE MEMORY DEVICE, METHOD OF MANUFACTURING NOR-TYPE MEMORY DEVICE, AND ELECTRONIC APPARATUS INCLUDING MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 483 days.

(21) Appl. No.: 18/176,238

(22) Filed: Feb. 28, 2023

(65) Prior Publication Data

US 2024/0008288 A1 Jan. 4, 2024

(30) Foreign Application Priority Data

Jul. 1, 2022 (CN) .......................... 202210777446.X

(51) Int. Cl.
*H10B 53/20* (2023.01)
*H10B 43/27* (2023.01)
(Continued)

(52) U.S. Cl.
CPC ............. *H10B 53/20* (2023.02); *H10B 43/27* (2023.02); *H10B 43/35* (2023.02); *H10B 53/30* (2023.02)

(58) Field of Classification Search
CPC ........ H10B 53/30; H10B 53/20; H10B 43/35; H10B 43/27
See application file for complete search history.

(56) References Cited

U.S. PATENT DOCUMENTS

2021/0242241 A1 8/2021 Rajashekhar et al.
2023/0044856 A1* 2/2023 Park ..................... H10B 12/315
(Continued)

FOREIGN PATENT DOCUMENTS

TW       201232538 A       8/2012
TW       201711138 A       3/2017

OTHER PUBLICATIONS

Office Action from Taiwan Application No. 112104578, dated Mar. 26, 2024, 17 pages.

*Primary Examiner* — Richard A Booth
(74) *Attorney, Agent, or Firm* — Kinney & Lange, P.A.

(57) ABSTRACT

Disclosed are a NOR-type memory device, a method of manufacturing the NOR-type memory device, and an electronic apparatus. The NOR-type memory device includes: a memory cell layer including a first source/drain layer, a first channel layer, a second source/drain layer, a second channel layer, and a third source/drain layer which are stacked in a vertical direction; a gate stack that extends vertically and includes a gate conductor layer and a memory functional layer between the gate conductor layer and the memory cell layer; and at least one of a source line contact portion and a bulk contact portion. The source line contact portion extends vertically to pass through the memory cell layer, and is electrically connected to the first and third source/drain layers. The bulk contact portion extends vertically to pass through the memory cell layer, and is electrically connected to the first and second channel layers.

20 Claims, 18 Drawing Sheets

(51) Int. Cl.
     *H10B 43/35*        (2023.01)
     *H10B 53/30*        (2023.01)

(56)                 References Cited

U.S. PATENT DOCUMENTS

2023/0402392 A1 *  12/2023  Zhu ..................... H01L 23/5383
2025/0063764 A1 *   2/2025  Lin ....................... H10D 64/01

* cited by examiner 125　　127

101

A　　　　　　　　　　　　　　　　　　　　　　　A'

S/D　　111　　109

101

A　　　　　　　　　　　　　　　　　　　　　　　A'

131

119
121

101

123

113

101

163

165a

165b 145b    145a    143    139    141

NOR-TYPE MEMORY DEVICE, METHOD OF MANUFACTURING NOR-TYPE MEMORY DEVICE, AND ELECTRONIC APPARATUS INCLUDING MEMORY DEVICE

CROSS-REFERENCE TO RELATED APPLICATION(S)

This application claims priority to Chinese Application No. 202210777446.X filed on Jul. 1, 2022 which is incorporated herein by reference in its entirety.

TECHNICAL FIELD

The present disclosure relates to the field of semiconductors, and more particularly, to a NOR-type memory device, a method of manufacturing the NOR-type memory device, and an electronic apparatus including the memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

Vertical devices may be stacked to increase the integration density. However, this may lead to poor performance. Because in order to stack a plurality of devices conveniently, polycrystalline silicon is usually used as a channel material, resulting in a greater resistance compared with using monocrystalline silicon as the channel material. In addition, it is desired to further increase the integration density and improve the performance.

SUMMARY

In view of the above, the present disclosure aims to provide, among others, a NOR-type memory device with an improved integration density, an improved performance, an improved reliability, and an optimized manufacturing process, a method of manufacturing the NOR-type memory device, and an electronic apparatus including the memory device.

According to an aspect of the present disclosure, there is provided a vertical memory device, including: at least one memory cell layer disposed on a substrate, wherein the at least one memory cell layer includes a first source/drain layer, a first channel layer, a second source/drain layer, a second channel layer, and a third source/drain layer which are stacked in a vertical direction; at least one gate stack that extends vertically with respect to the substrate to pass through the at least one memory cell layer, wherein the at least one gate stack includes a gate conductor layer and a memory functional layer disposed between the gate conductor layer and the at least one memory cell layer, and a memory cell is defined at an intersection of the at least one gate stack and the at least one memory cell layer; and at least one of a source line contact portion and a bulk contact portion. The source line contact portion extends vertically with respect to the substrate to pass through the at least one memory cell layer. At a position where the source line contact portion is located, the first source/drain layer and the third source/drain layer in the at least one memory cell layer are electrically connected to the source line contact portion respectively. The bulk contact portion extends vertically with respect to the substrate to pass through the at least one memory cell layer. At a position where the bulk contact portion is located, the first channel layer and the second channel layer in the at least one memory cell layer are electrically connected to the bulk contact portion respectively.

According to another aspect of the present disclosure, there is provided a method of manufacturing a vertical memory device, including: disposing at least one memory cell layer on a substrate including a contact region and a device region, wherein the at least one memory cell layer includes a first source/drain layer, a first channel layer, a second source/drain layer, a second channel layer, and a third source/drain layer which are stacked in a vertical direction; forming, in the device region, at least one gate hole that extends vertically with respect to the substrate to pass through the at least one memory cell layer; forming, in each of the at least one gate hole, a corresponding gate stack, wherein the gate stack includes a gate conductor layer and a memory functional layer disposed between the gate conductor layer and the at least one memory cell layer; forming, in the contact region, a first contact hole that extends vertically with respect to the substrate to pass through the at least one memory cell layer; indenting at least a part of a sidewall of the second source/drain layer exposed in the first contact hole transversely by selective etching, so as to form a transverse channel; introducing an etchant via the first contact hole to etch at least the second source/drain layer, wherein the etchant further acts with the second source/drain layer through the transverse channel, so that the second source/drain layer is relatively recessed in the first contact hole; and forming, in the first contact hole, a first contact portion electrically isolated from the second source/drain layer.

According to another aspect of the present disclosure, there is provided an electronic apparatus including the NOR-type memory device described above.

According to embodiments of the present disclosure, a stack of single crystal material may be used as a building block to build a three-dimensional (3D) NOR-type memory device. Therefore, when a plurality of memory cells are stacked, an increase of resistance may be suppressed. Between the memory cell layers, especially between adjacent bit lines (BL) in a vertical direction, there is no need to provide an additional isolation layer. This may optimize the process and facilitate the increase of integration. By providing a common source line contact portion and/or bulk contact portion, the number of contact portions may be reduced and thus the area may be saved.

BRIEF DESCRIPTION OF THE DRAWINGS

The above and other objects, features, and advantages of the present disclosure will become more apparent from following descriptions on embodiments thereof with reference to attached drawings, in which:

FIGS. 1, 2(*b*), 3 to 5, 6(*b*), 7(*a*), 8(*a*), 9, 10, 11(*b*), and 20(*b*) are cross-sectional views taken along line AA';

FIGS. 6(*c*), 7(*b*), and 8(*b*) are cross-sectional views taken along line BB';

FIGS. 11(*c*) and 12 are cross-sectional views taken along line CC'/DD';

FIGS. 13(*a*), 14(*a*), 15(*a*), 17(*a*), 18, and 19(*a*) are cross-sectional views taken along line CC';

FIGS. 13(*b*), 14(*b*), 15(*b*), 16, 17(*b*), and 19(*b*) are cross-sectional views taken along line DD';

Throughout the drawings, the same or similar reference numbers denote the same or similar elements.

DETAILED DESCRIPTION OF EMBODIMENTS

Figure 1:
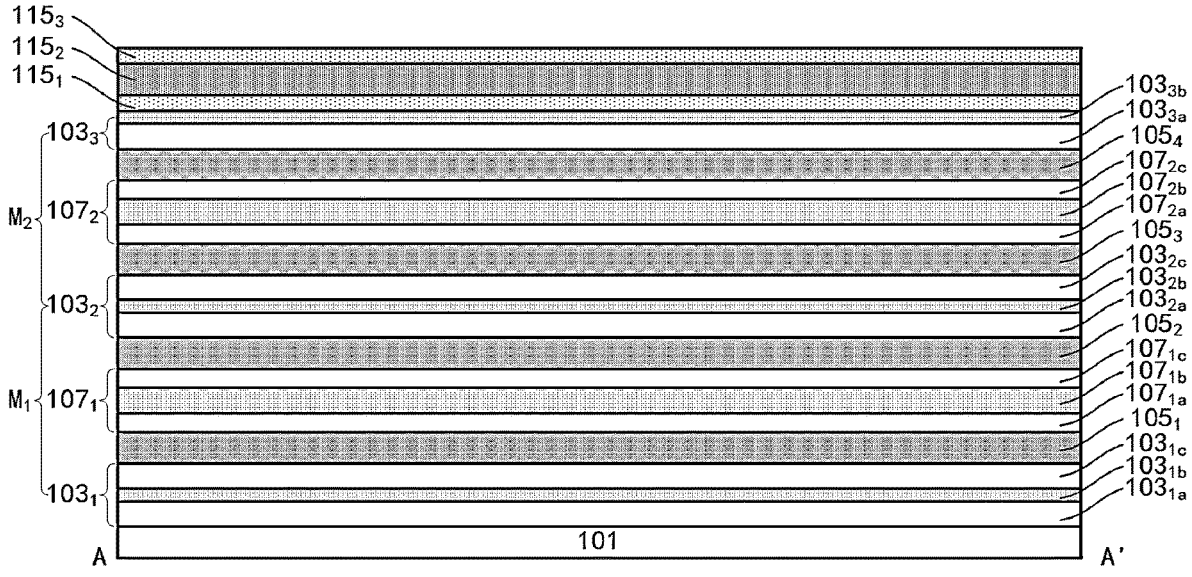
FIGS. 1 to 21 are schematic diagrams showing some stages in a process of manufacturing a NOR-type memory device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art may also devise regions/layers of other different shapes, sizes, and relative positions as desired in practice.

In the context of the present disclosure, when a layer/element is recited as being "on" a further layer/element, the layer/element may be disposed directly on the further layer/element, or otherwise there may be an intervening layer/element interposed therebetween. Further, if a layer/element is "on" a further layer/element in an orientation, then the layer/element may be "under" the further layer/element when the orientation is turned.

A memory device according to an embodiment of the present disclosure is based on a vertical device. The vertical device may include an active region arranged on a substrate in a vertical direction (a direction substantially perpendicular to a surface of the substrate). The active region includes source/drain regions at upper and lower ends of the active region and a channel region between the source/drain regions. A conductive channel may be formed between the source/drain regions through the channel region. In the active region, the source/drain regions and the channel region may be defined by, for example, a doping concentration.

According to an embodiment of the present disclosure, the active region may be defined by a stack of a lower source/drain layer, a channel layer, and an upper source/drain layer on the substrate. The source/drain regions may be formed in the lower source/drain layer and the upper source/drain layer respectively, and the channel region may be formed in the channel layer. A gate stack may extend through the stack, so that the active region may surround a periphery of the gate stack. Here, the gate stack may include a memory functional layer, such as at least one of a charge trapping material or a ferroelectric material, so as to achieve a memory function. In this way, the gate stack is cooperated with an active region opposite to the gate stack, so as to define a memory cell (or a cell composition device used to form the memory cell). Here, the memory cell may be a flash memory cell.

According to an embodiment of the present disclosure, adapting to an arrangement of a bit line (BL) and a source line (SL), a single memory cell may be defined based on two cell composition devices connected in parallel. For this purpose, a stack of a first source/drain layer, a first channel layer, a second source/drain layer, a second channel layer, and a third source/drain layer may be arranged. Accordingly, a gate stack passing through the stack may be opposite to the first source/drain layer, the first channel layer, and the second source/drain layer, so as to define a first cell composition device. In addition, the gate stack passing through the stack may be opposite to the second source/drain layer, the second channel layer, and the third source/drain layer, so as to define a second cell composition device. Such two cell composition devices may be electrically connected to the same BL (in parallel) through the common second source/drain layer. In addition, such two cell composition devices may be electrically connected to the same word line (WL) (through the gate stack). Accordingly, the first cell composition device and the second cell composition device (defining the single memory cell) may be addressed through the same BL and the same WL.

In a NOR (NOT OR)-type memory device, the memory cell may be electrically connected between the BL and the SL. When the second source/drain layer in the stack is electrically connected to the BL, the first source/drain layer and the third source/drain layer may be electrically connected to the SL.

A plurality of gate stacks may be arranged to pass through the stack, so as to define a plurality of memory cells at intersections of the plurality of gate stacks and the stack. In a plane where the stack is located, these memory cells are arranged into an array (for example, generally, a two-dimensional array arranged in rows and columns) corresponding to the plurality of gate stacks.

Since the vertical device is easy to be stacked, the memory device according to an embodiment of the present disclosure may be a three-dimensional (3D) array. Specifically, a plurality of such stacks may be arranged in the vertical direction. The gate stack may extend vertically, so as to pass through the plurality of stacks. In this way, for a single gate stack, it intersects the plurality of stacks stacked in the vertical direction to define a plurality of memory cells stacked in the vertical direction.

Such stacks may be formed by epitaxial growth on the substrate and may be made of a single crystal semiconductor material. Various layers in the stack may be doped in situ respectively during the growth, and there may be a doping concentration interface between different doped layers. In this way, a doping distribution in the vertical direction may be better controlled. The stack of the lower source/drain layer, the channel layer, and the upper source/drain layer may form a bulk material, and thus the channel region is formed in the bulk material. In this case, the process is relatively simple.

In the conventional process, an isolation layer needs to be arranged between (at least) some stacks to electrically isolate BLs adjacent to each other. A relatively complex process is required to form an arrangement in which (a semiconductor, especially a single crystal semiconductor) stack and the isolation layer are stacked on each other. According to an embodiment of the present disclosure, respective stacks may be in direct contact with each other.

For example, for a lower stack and an upper stack located above the lower stack, the uppermost source/drain layer (i.e., the third source/drain layer) of the lower stack may be the same layer as the lowermost source/drain layer (i.e., the first source/drain layer) of the upper stack, and/or the lowermost source/drain layer (i.e., the first source/drain layer) of the upper stack may be the same layer as the uppermost source/drain layer (i.e., the third source/drain layer) of the lower stack. It is relatively easy to form a plurality of (semiconductor, especially single crystal semiconductor) stacks stacked on each other. Moreover, although there is the isolation layer between adjacent BLs, mutual interference may exist between the adjacent BLs. In contrast, according to an embodiment of the present disclosure, each BL is separated from another BL by at least one SL and a cell composition device electrically connected to the SL, so the mutual interference between different BLs may be effectively suppressed and reliability may be improved.

In addition, although compared with the conventional process in which the memory cell is based on a single cell composition device, the memory cell according to the embodiment of the present disclosure is based on more (that is, two) cell composition devices and thus has a larger size (for example, has a larger height), an integration density of the memory cell according to the embodiment of the present disclosure may also be improved because the isolation layer may be omitted and the manufacturing process, especially the process of forming the stack as above, is optimized.

According to an embodiment of the present disclosure, in order to reduce the number of contact portions, memory cells at different heights in the vertical direction may share a common contact portion, e.g. a common SL contact portion and/or a common bulk contact portion. The common contact portion may be vertically extended to pass through each memory cell layer, and electrically connected to a corresponding layer in each memory cell layer (for example, by contacting each other). For example, the common SL contact portion may be electrically connected to the first source/drain layer and the third source/drain layer in each memory cell layer, while the common bulk contact portion may be electrically connected to the first channel layer and the second channel layer in each memory cell layer. According to an embodiment, the SL contact portion may be integral with the bulk contact portion, that is, the common contact portion may be electrically connected to the first source/drain layer, the third source/drain layer, the first channel layer and the second channel layer in each memory cell layer concurrently.

According to an embodiment of the present disclosure, on each gate stack a corresponding select transistor may be disposed in order to reduce the number of interconnections. As described below, the select transistor may be self-aligned to the corresponding gate stack.

Such vertical memory device may be manufactured as follows. Specifically, a plurality of memory cell layers may be disposed on the substrate. Each of the plurality of memory cell layers includes e.g. the stack of the first source/drain layer, the first channel layer, the second source/drain layer, the second channel layer, and the third source/drain layer. For example, these layers may be provided by epitaxial growth. A thickness of each layer, especially a thickness of the channel layer, may be controlled during epitaxial growth. In addition, in situ doping may be performed during epitaxial growth, so as to achieve a desired doping polarity and doping concentration. Here, each layer in the stack may include the same material. In this case, the so-called "layers" may be defined by a doping concentration interface between them.

A gate hole, which extends vertically with respect to the substrate to pass through the stack in each memory cell layer, may be formed in the device region. The gate stack may be formed in the gate hole, and the select transistor may be fabricated on the gate stack.

A first contact hole, which extends vertically with respect to the substrate to pass through the stack in each memory cell layer, may be formed in the contact region. At least a portion of a sidewall of the second source/drain layer exposed in the first contact hole may be indented transversely by selective etching, so as to form a transverse channel. Such transverse channel causes the second source/drain layer to be more exposed, so that the second source/drain layer may then be more etched by an etchant introduced via the first contact hole, so as to be recessed with respect to the first source/drain layer and the third source/drain layer. If the adopted etching recipe may also etch the first channel layer and the second channel layer and the etching amount is relatively large, the first channel layer and the second channel layer may also be recessed with respect to the first source/drain layer and the third source/drain layer. Accordingly, the first source/drain layer and the third source/drain layer that protrude with respect to the second source/drain layer (and, optionally, the first channel layer and the second channel layer) may be achieved in the first contact hole. Therefore, a first contact portion, such as an SL contact portion, which is electrically connected to the first source/drain layer and the third source/drain layer and electrically isolated from the second source/drain layer (and optionally, the first channel layer and the second channel layer), may be formed in the first contact hole.

In addition, a second contact hole, which extends vertically with respect to the substrate to pass through the stack in each memory cell layer, may be formed in the contact region. At least a portion of a sidewall of each of the first source/drain layer, the second source/drain layer and the third source/drain layer exposed in the second contact hole may be indented transversely by selective etching, so as to form transverse channels. Similarly, such transverse channels cause the first source/drain layer, the second source/drain layer and the third source/drain layer to be more exposed, so that the first source/drain layer, the second source/drain layer and the third source/drain layer may then be more etched by an etchant introduced via the second contact hole, so as to be recessed with respect to the first channel layer and the second channel layer. Accordingly, the first channel layer and the second channel layer that protrude with respect to the first source/drain layer, the second source/drain layer and the third source/drain layer may be achieved in the second contact hole. Therefore, a second contact portion, such as a bulk contact portion, which is electrically connected to the first channel layer and the second channel layer and electrically isolated from the first source/drain layer, the second source/drain layer and the third source/drain layer, may be formed in the second contact hole.

In order to achieve such selective etching, the source/drain layer may include a stack structure, e.g. a stack of an upper sub-layer, an intermediate sub-layer and an upper sub-layer. The intermediate sub-layer may have etching selectivity with respect to the upper sub-layer and the lower sub-layer, so that the intermediate sub-layer may be selectively etched to achieve the transverse channel described above. In addition, the upper sub-layer and the lower sub-layer may have substantially the same material as that of an adjacent channel layer.

The present disclosure may be presented in various forms, and some examples of which will be described below. In the following description, the selection of various materials is involved. In selecting the materials, etching selectivity is considered in addition to the function of the materials (for example, a semiconductor material is used to form the active region, a dielectric material is used to form an electrical isolation, and a conductive material is used to form an electrode, an interconnection structure, etc.). In the following description, the required etching selectivity may or may not be indicated. It should be clear to those skilled in the art that when etching a certain material layer is mentioned below, if it is not mentioned that other layers are also etched or the drawing does not show that other layers are also etched, then this etching may be selective, and the material layer may have etching selectivity with respect to other layers exposed to the same etching recipe.

FIGS. 1 to 21 are schematic diagrams showing some stages in a process of manufacturing a NOR-type memory device according to an embodiment of the present disclosure.

As shown in FIG. 1, a substrate 101 is provided. The substrate 101 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate, such as a Si wafer, will be described by way of example for the convenience of description.

On the substrate 101, a memory device, such as a NOR-type flash memory, may be formed as described below. A memory cell in the memory device may include an n-type cell composition device or a p-type cell composition device. Here, an n-type cell composition device is described as an example. For this purpose, a p-type well may be formed in the substrate 101. Therefore, the following description, in particular the description of a doping type, is for forming the n-type cell composition device. However, the present disclosure is not limited thereto.

On the substrate 101, source/drain layers $103_1$, $107_1$, $103_2$, $107_2$, and $103_3$ and channel layers $105_1$, $105_2$, $105_3$, and $105_4$ may be formed alternately by, for example, epitaxial growth, so that each of the channel layers $105_1$, $105_2$, $105_3$, and $105_4$ may have source/drain layers adjacent to the each of the channel layers on upper and lower sides of the each of the channel layers respectively. Accordingly, each of the channel layers $105_1$, $105_2$, $105_3$, and $105_4$ along with the upper and lower adjacent source/drain layers may define a respective device layer. (An array of) cell composition devices may be formed in each device layer, and active regions of such cell composition devices may be defined by corresponding device layers. Adjacent device layers may share a common source/drain layer (and thus are electrically connected to each other).

In an example of FIG. 1, four device layers corresponding to the four channel layers $105_1$, $105_2$, $105_3$, and $105_4$ are shown, but the present disclosure is not limited thereto. For example, there may be more (or less) channel layers, and thus there may be more (or less) device layers.

FIG. 1 further shows memory cell layers M1 and M2. As further described below, in an embodiment of the present disclosure, a memory cell is defined by a pair of cell composition devices (which are connected in parallel and) adjacent to each other in the vertical direction, and the pair of cell composition devices are respectively formed in a pair of adjacent device layers. Accordingly, each of the memory cell layers M1 and M2 may correspond to a respective pair of device layers, and an array of memory cells may be formed in each memory cell layer (corresponding to an array of cell composition devices in the corresponding pair of device layers).

Here, different reference numbers $103_n$ (n=1, 2, 3 in the example of FIG. 1; and n may be larger in a case of more device layers) and $107_m$ (m=1, 2 in the example of FIG. 1; and m may be larger in the case of more device layers) may be used for source/drain layers on an upper side and a lower side of the same channel layer, partially because they may be electrically connected differently in subsequence (for example, they may be connected to SL and BL respectively; and in the following, a source/drain layer denoted by $103_n$ may be connected to SL, while a source/drain layer denoted by $107_m$ may be connected to BL). However, it does not mean that the source/drain layers on the upper and lower sides of the same channel layer must have different characteristics (for example, geometric characteristics such as thickness, material characteristics such as composition, doping characteristics such as doped elements and concentration, etc.; of course, it is possible for the source/drain layers to be different in at least one aspect).

In addition, each of the source/drain layers $103_n$ and $107_m$ may have a stack structure. For example, as shown in FIG. 1, each of the source/drain layers $103_n$ and $107_m$ may have sub-layers denoted by subscripts a, b, and c respectively. Since a channel layer is no longer provided above the top source/drain layer $103_3$, the source/drain layer $103_3$ may have only a sub-layer $103_{3a}$ which is used to define the source/drain region for a cell composition device based on the channel layer $105_4$ as described in the following and a sub-layer $103_{3b}$ used to assist forming an SL electrical connection as described in the following, without a sub-layer denoted by subscript c (of course, it is also possible to provide such sub-layer, just like other source/drain layers). Similarly, the lowest source/drain layer $103_1$ may not have a sub-layer denoted by subscript a, because a channel layer is no longer provided below the lowest source/drain layer $103_1$. However, the sub-layer $103_{1a}$ is still provided here, so as to provide a space for arranging an electrical isolation between the SL contact portion, the bulk contact portion and the substrate as described below. It should be noted that such stack structure of the source/drain layers $103_n$ and $107_m$ is to provide a required etching selectivity as described below, but the present disclosure is not limited thereto.

One or more (or even all) of these source/drain layers and channel layers formed on the substrate 101, especially the channel layer, may be a single crystal semiconductor layer. These layers may have a crystal interface or a doping concentration interface between each other because they are grown or doped separately.

The source/drain layers $103_1$, $107_1$, $103_2$, $107_2$, and $103_3$ may define source/drain regions of the cell composition device. The source/drain layers $103_1$, $107_1$, $1003_2$, $107_2$, and $103_3$ (specifically, each sub-layer of the source/drain layers $103_1$, $107_1$, $1003_2$, $107_2$, and $103_3$) may form the source/drain regions by doping (e.g. by in situ doping during growth). For the n-type cell composition device, n-type doping may be performed by using As or P, and the doping concentration may be about $5E18 \text{ cm}^{-3}$ to $1E21 \text{ cm}^{-3}$, for example.

Figure 19A:
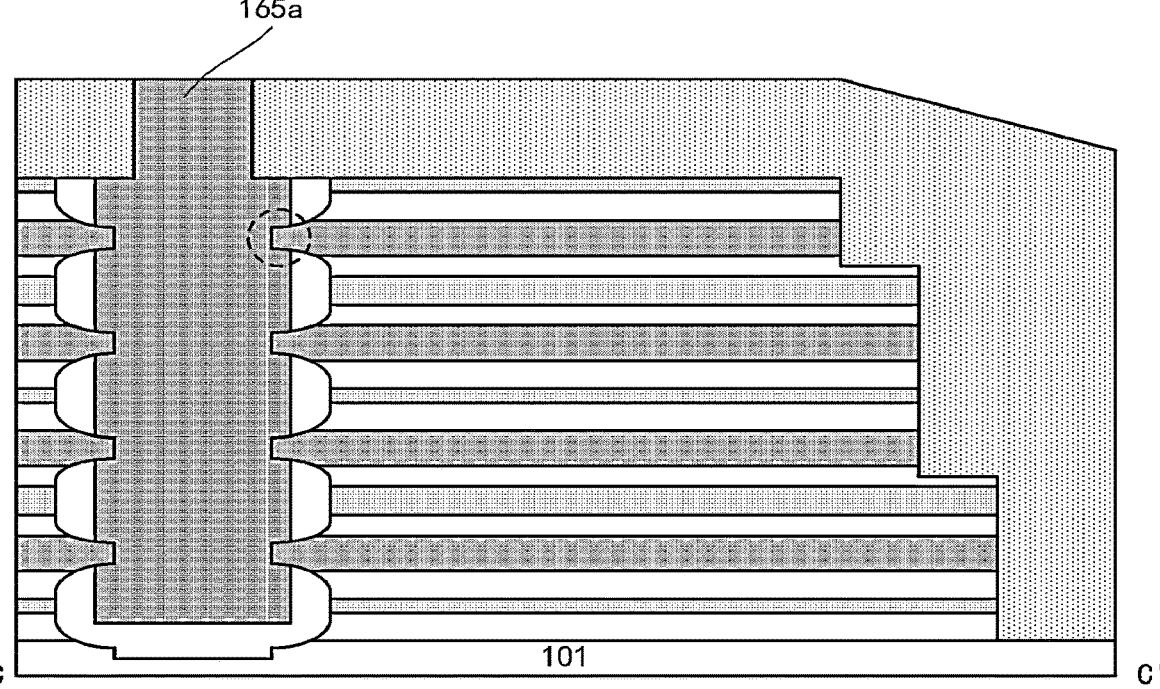
Figure 19B:
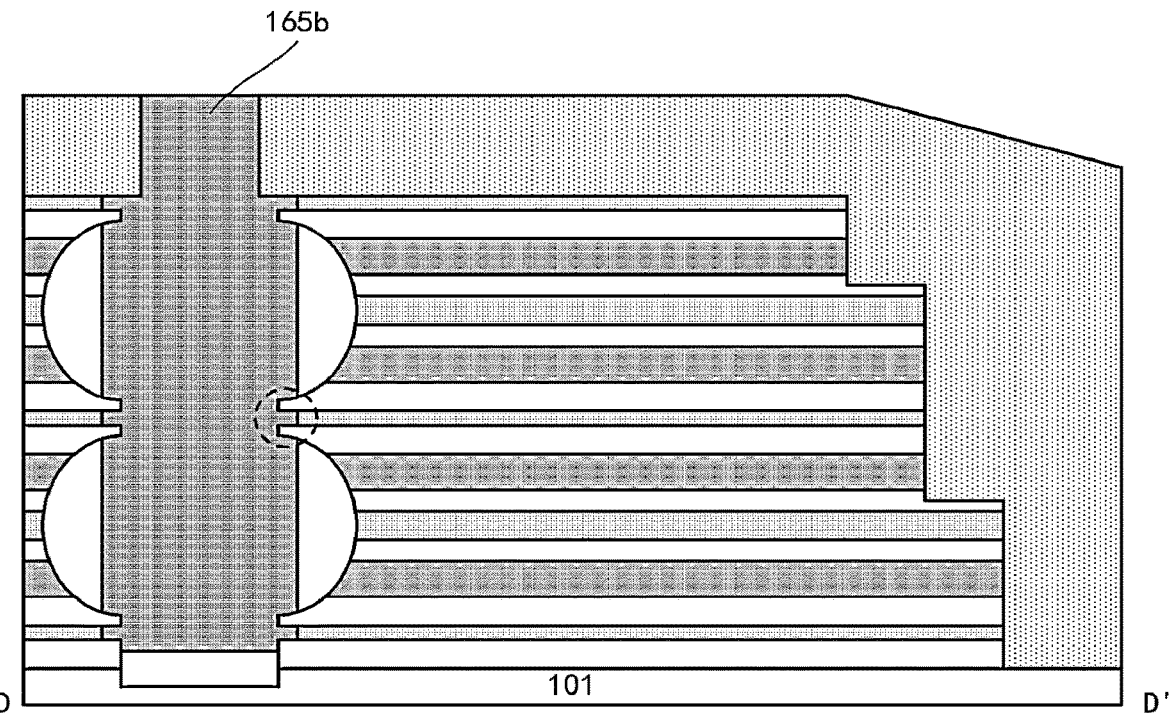

In the source/drain layer $103_n$ (n=1, 2, 3, . . . ), a thickness ($T_{bt}$) of the lowest sub-layer $103_{1a}$ may be relatively large, e.g. about 20 nm to 150 nm, so as to provide an enough space for subsequent providing an electrical isolation between the SL contact portion, the bulk contact portion and the substrate (for example, see FIGS. 19(a) and 19(b)). Each of the sub-layers $103_{1c}$, $103_{2a}$, $103_{2c}$ and $103_{3a}$ adjacent to the channel layers $105_1$, $105_2$, $105_3$ and $105_4$ may define a source/drain region of a corresponding device, and may have a thickness (represented by $T_{sl}$) of about 20 nm to 150 nm (the thickness of the sub-layers $103_{1c}$, $103_{2a}$, $103_{2c}$ and $103_{3a}$ may be set for each source/drain layers separately, and may be substantially equal or unequal between different source/drain layers). Each of middle sub-layers $103_{1b}$, $103_{2b}$ and $103_{3b}$ (since the top sub-layer $103_{3b}$ is functionally equivalent to other middle sub-layers $103_{1b}$ and $103_{2b}$, the top sub-layer $103_{3b}$ is also called the "middle" sub-layer for convenience; and although no sub-layer is provided above the top sub-layer $103_{3b}$, it is also possible to provide another sub-layer on the top sub-layer $103_{3b}$) may be considered as an electrical connection to the SL, and mat have a thickness (represented by $T_s$) of about 10 nm to 50 nm (the thickness of the sub-layers $103_{1b}$, $103_{2b}$ and $103_{3b}$ may be set for each source/drain layer separately, and may be substantially equal or unequal between different source/drain layers). Note that each sub-layer of each source/drain layer $103_n$ is considered as a source/drain region or an electrical connection to the SL here. This is just to better understand the structure of the memory device according to the embodiment of the present disclosure. According to an embodiment, respective sub-layers of each source/drain layer $103_n$ may together define a source/drain region.

In the source/drain layer $107_m$ (n=1, 2, . . . ), each of the sub-layers $107_{1a}$, $107_{1c}$, $107_{2a}$ and $107_{2c}$ adjacent to the channel layers $105_1$, $105_2$, $105_3$ and $105_4$ may define a source/drain region of a corresponding device, and may have a thickness (represented by $T_{bl}$) of about 20 nm to 150 nm (the thickness of each of the sub-layers $107_{1a}$, $107_{1c}$, $107_{2a}$ and $107_{2c}$ of the source/drain layers may be set respectively, and may be substantially equal or unequal to each other). Each of middle sub-layers $107_{1b}$ and $107_{2b}$ may be considered as an electrical connection to the BL, and may have a thickness (represented by $T_b$) of about 10 nm to 50 nm (the thickness of the sub-layers $107_{1b}$ and $107_{2b}$ may be set for each the source/drain layer separately, and may be substantially equal or unequal between different source/drain layers). Similarly, each sub-layer of each source/drain layer $107_m$ is considered as a source/drain region or an electrical connection to the BL here. This is just to better understand the structure of the memory device according to the embodiment of the present disclosure. According to an embodiment, respective sub-layers of each source/drain layer $107_m$ may together define a source/drain region.

For the source/drain layers $107_m$ and $103_n$ adjacent to each channel layer, a thickness $T_{bl}$ of a sub-layer $107_{ma}$ (or $107_{mc}$) adjacent to the channel layer may be substantially equal to a thickness $T_{sl}$ of a sub-layer $103_{nc}$ (or $103_{na}$) adjacent to the channel layer, and a thickness $T_b$ of a sub-layer $107_{mb}$ may be unequal to, preferably greater than, a thickness $T_s$ of a sub-layer $103_{nb}$. For example, for the channel layer $105_1$, the thickness of the sub-layer $107_{1a}$ adjacent to the channel layer $105_1$ may be substantially equal to the thickness of the sub-layer $103_{1c}$ adjacent to the channel layer $105_1$, and the thickness of corresponding sub-layer $107_{1b}$ may be greater than the thickness of corresponding sub-layer $103_{1b}$, and so on. This is because according to the embodiment of the present disclosure, a current flowing through BL is greater than a current flowing through SL. When a pair of cell composition devices connected in parallel to the same BL are respectively connected to the corresponding SLs, the current flowing through BL may be approximately twice the current flowing through SL.

The channel layers $105_1$, $105_2$, $105_3$, and $105_4$ may define a channel region of the cell composition device. A thickness (represented by $T_{lg}$) of each of the channel layers $105_1$, $105_2$, $105_3$, and $105_4$ may define a gate length of the cell composition device, for example, about 40 nm to 300 nm. The thickness of each of the channel layers $105_1$, $105_2$, $105_3$, and $105_4$ may be set respectively, and the channel layers $105_1$, $105_2$, $105_3$, and $105_4$ may have approximately equal or unequal thickness. The channel layers $105_1$, $105_2$, $105_3$, and $105_4$ may not be intentionally doped, or may be lightly doped by in situ doping during growth, so as to improve a short channel effect (SCE), adjust a threshold voltage ($V_t$) of the device, and the like. For example, for the n-type cell composition device, p-type doping may be performed by using B and the like, and the doping concentration is about $1E17$ $cm^{-3}$ to $2E19$ $cm^{-3}$. In addition, in order to optimize the device performance, the doping concentration in the channel layer may have a non-uniform distribution in the vertical direction, e.g. have a higher doping concentration in a part of the channel region close to a drain region (connected to BL) to improve the SCE, while a lower doping concentration in a part of the channel region close to a source region (connected to SL) to reduce the channel resistance.

These semiconductor layers may include various suitable semiconductor materials, for example, an element semiconductor material such as Si or Ge, a compound semiconductor material such as SiGe, etc. In the example where the substrate 101 is the silicon wafer, the source/drain layer and the channel layer may include a silicon-based material. In addition, considering the selective etching required in the following processes, the middle sub-layer in each source/drain layer may have etching selectivity with respect to the sub-layers above and below the middle sub-layer. For example, each channel layer may include Si, and the sub-layers denoted by subscripts a and c in each source/drain layer may include Si, while the sub-layers denoted by subscript b may include SiGe (for example, the atomic percentage of Ge is about 15% to 30%). However, the present disclosure is not limited thereto.

A hard mask layer may be provided on such semiconductor layers formed on the substrate 101, to facilitate patterning. In this example, in order to facilitate the subsequent formation of the select transistor, the hard mask layer may include a stack configuration, e.g. including a first sub-layer $115_1$, a second sub-layer $115_2$, and a third sub-layer $115_3$. The first sub-layer $115_1$ and the third sub-layer $115_3$ may be solid phase dopant sources, so as to facilitate subsequent doping of the select transistor. Considering the etching selectivity in the subsequent process, the first sub-layer $115_1$ and the third sub-layer $115_3$ may include oxide (for example, silicon oxide), which contain a dopant such as P to be used as the solid phase dopant source, while the second sub-layer $115_2$ may include nitride (for example, silicon nitride). A thickness of each sub-layer is, for example, about 50 nm to 200 nm.

In the device layer formed as described above, the cell composition device may be fabricated, so as to form the memory cell.

Figure 2A:
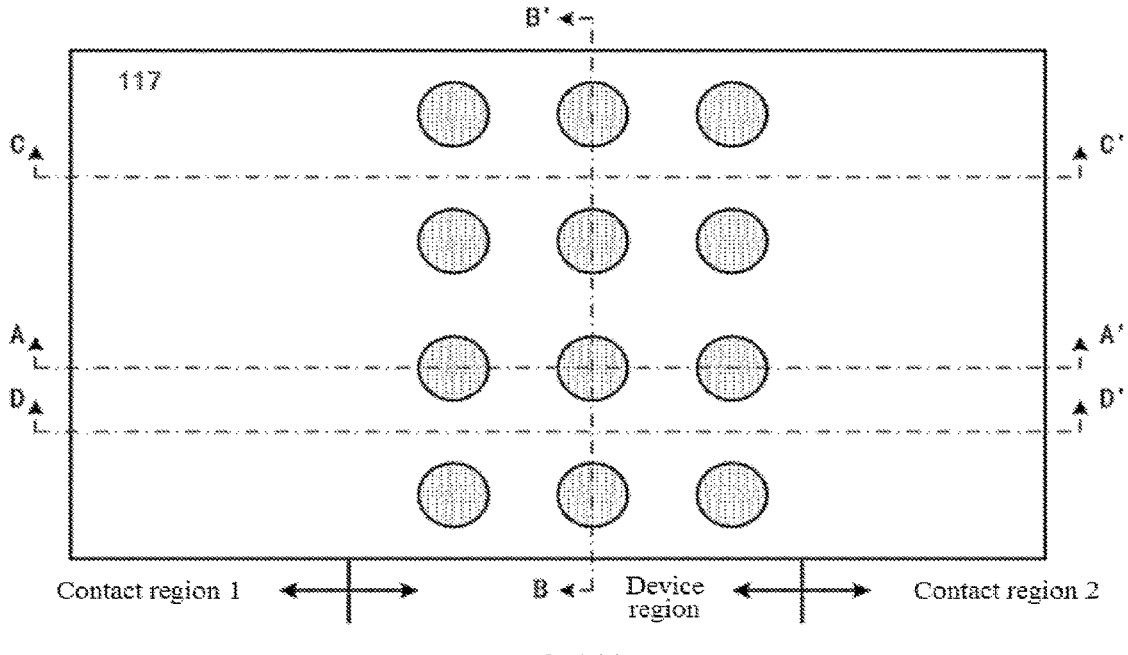
Figure 2B:
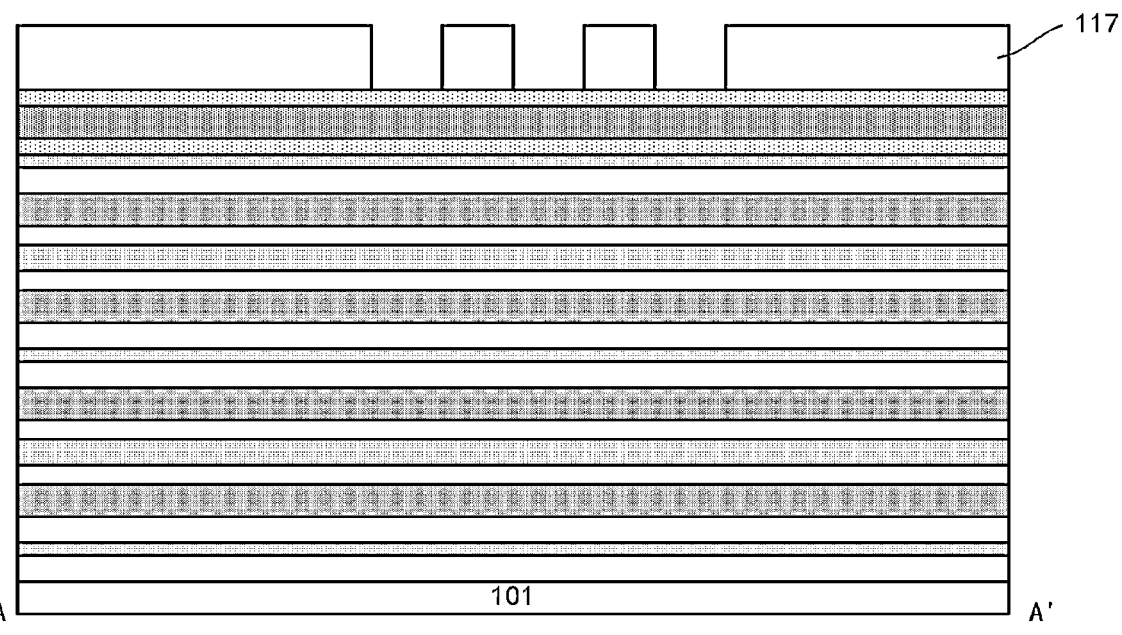

For example, as shown in FIGS. 2(a) and 2(b), a photoresist 117 may be formed on the hard mask layer. The photoresist 117 may be patterned to have a plurality of openings (in the device region on the substrate) by photolithography, and these openings may define positions of gate holes in which the gate stacks are to be formed. The opening may have various suitable shapes, such as round, rectangular, square, polygon, etc. and has a suitable size, such as a diameter or side length of about 20 nm to 500 nm. Here, these openings may be arranged in an array form, such as a two-dimensional array along horizontal and vertical directions in paper in FIG. 2(a). The array may then define an array of cell composition devices (and thus an array of memory cells). According to an embodiment of the present disclosure, these openings may have different arrangements, sizes, and shapes from each other.

In this example, as shown in FIG. 2(a), the substrate may include a device region for forming the cell composition device (and thus the memory cell) (and optionally, the select transistor), and a contact region adjacent to the device region. In this example, the contact region may include a contact region 1 for SL and a contact region 2 for BL. For example, the contact region 1 and the contact region 2 may be respectively arranged on opposite sides of the device region. However, the present disclosure is not limited thereto. An arrangement of the contact region 1, the contact region 2, and the device region may be changed according to the circuit design.

Figure 3:
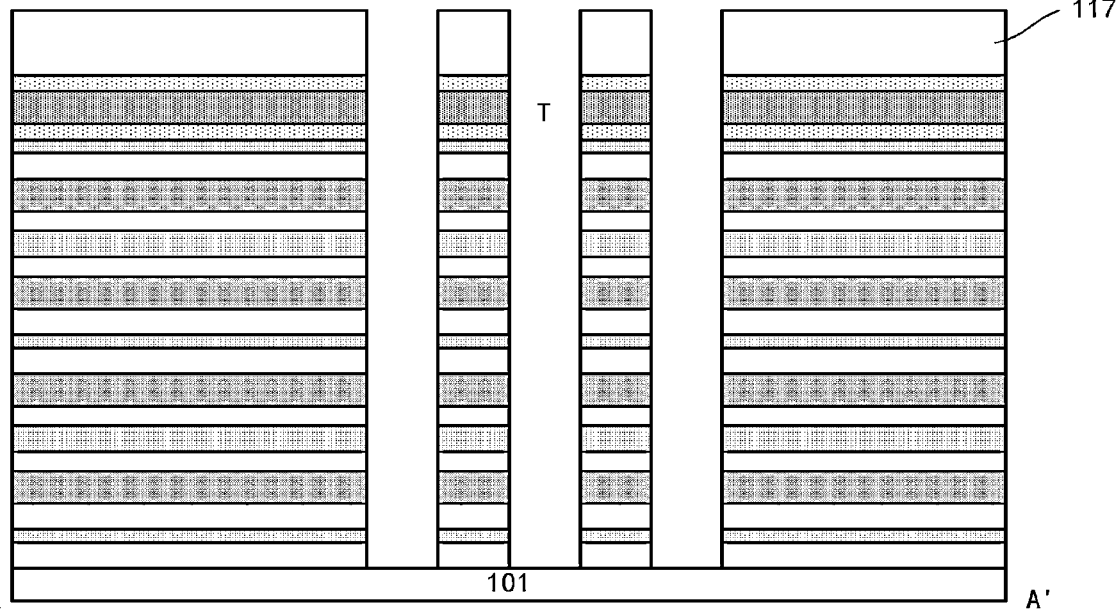

As shown in FIG. 3, the patterned photoresist 117 may be used as an etching mask to etch each layer on the substrate 101 by anisotropic etching, such as reactive ion etching (RIE), so as to form a gate hole T. RIE may be performed in a substantially vertical direction (for example, a direction perpendicular to the substrate surface) and may be performed into the substrate 101. Accordingly, a plurality of vertical gate holes T are left on the substrate 101. Then, the photoresist 117 may be removed.

The gate stack may be formed in the gate hole T. Here, a memory function may be achieved by the gate stack. For example, the gate stack may include a memory structure, such as a charge trapping layer or a ferroelectric material.

Figure 4:
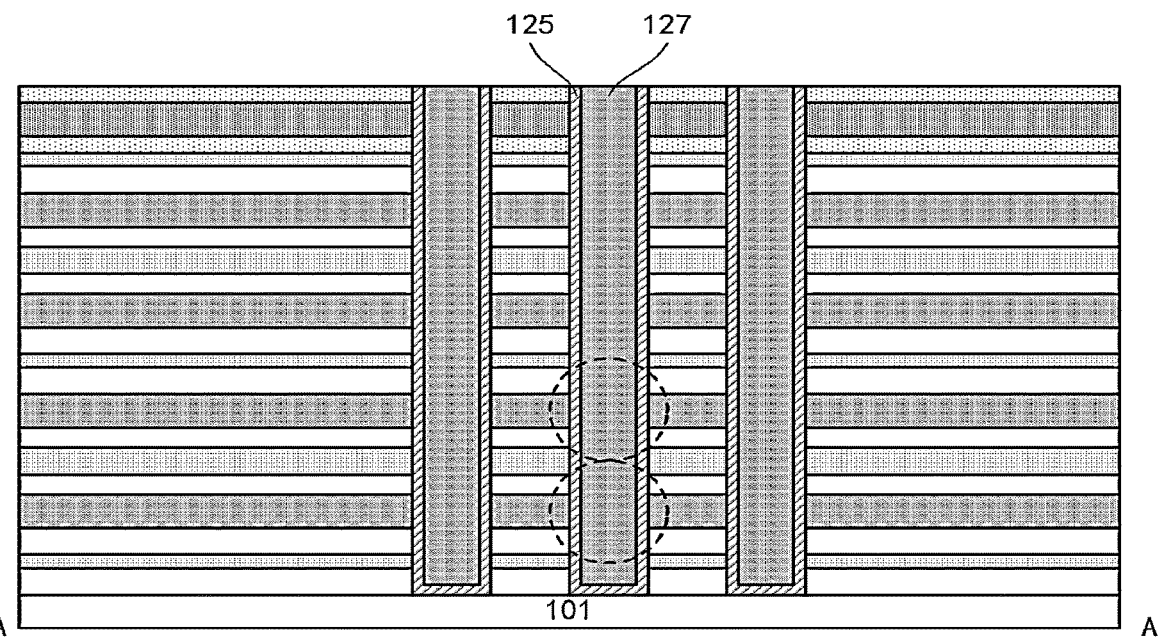

As shown in FIG. 4, the memory functional layer 125 and the gate conductor layer 127 may be formed sequentially by, for example, deposition. The memory functional layer 125 may be formed in a substantially conformal manner. A gap left after the memory functional layer 125 is formed in the gate hole T may be filled with the gate conductor layer 127. A planarization treatment, such as chemical mechanical polishing (CMP, for example, CMP may stop at the hard mask layer), may be performed on the formed gate conductor layer 127 and the formed memory function layer 125, so that the gate conductor layer 127 and the memory functional layer 125 may be left in the gate hole T to form the gate stack.

The memory functional layer 125 may be based on a dielectric charge trapping, a ferroelectric material effect or a bandgap engineering charge memory (SONOS), etc. For example, the memory functional layer 125 may include a dielectric tunneling layer (such as an oxide with a thickness of about 1 nm to 5 nm, which may be formed by oxidation or ALD), an energy band offset layer (such as a nitride with a thickness of about 2 nm to 10 nm, which may be formed by CVD or ALD), and an isolation layer (such as an oxide with a thickness of about 2 nm to 6 nm, which may be formed by oxidation, CVD or ALD). Such three-layer structure may lead to an energy band structure that traps electrons or holes. Alternatively, the memory functional layer 125 may include a ferroelectric material layer, such as $HfZrO_2$ with a thickness of about 2 nm to 20 nm.

The gate conductor layer 127 may include, for example, (doped, such as p-doped in the case of the n-type cell composition device) polysilicon or a metal gate material.

As shown in FIG. 4, the gate stack (125/127) having the memory functional layer is surrounded by the active region. The gate stack is cooperated with the active region (the stack of the source/drain layer, the channel layer, and the source/drain layer) to define the cell composition device, as shown in a dotted circle in FIG. 4. The channel region formed in the channel layer may be connected to source/drain regions formed in source/drain layers at opposite ends of the channel region, and the channel region may be controlled by the gate stack. FIG. 4 shows a pair of cell composition devices adjacent to each other in the vertical direction with two dotted lines. As described below, the pair of cell composition devices then define a single memory cell.

The gate stack extends in a column shape in the vertical direction and intersects with a plurality of device layers, so as to define a plurality of cell composition devices (and thus, a plurality of memory cells) stacked on each other in the vertical direction. Memory cells associated with a single gate stack column may form a memory cell string. Corresponding to an arrangement of the gate stack columns (corresponding to the above arrangement of the gate holes T, such as the two-dimensional array), a plurality of such memory cell strings are arranged on the substrate, so as to form a three-dimensional (3D) array of memory cells.

In addition, select transistors may be formed above each memory cell string respectively.

Figure 5:
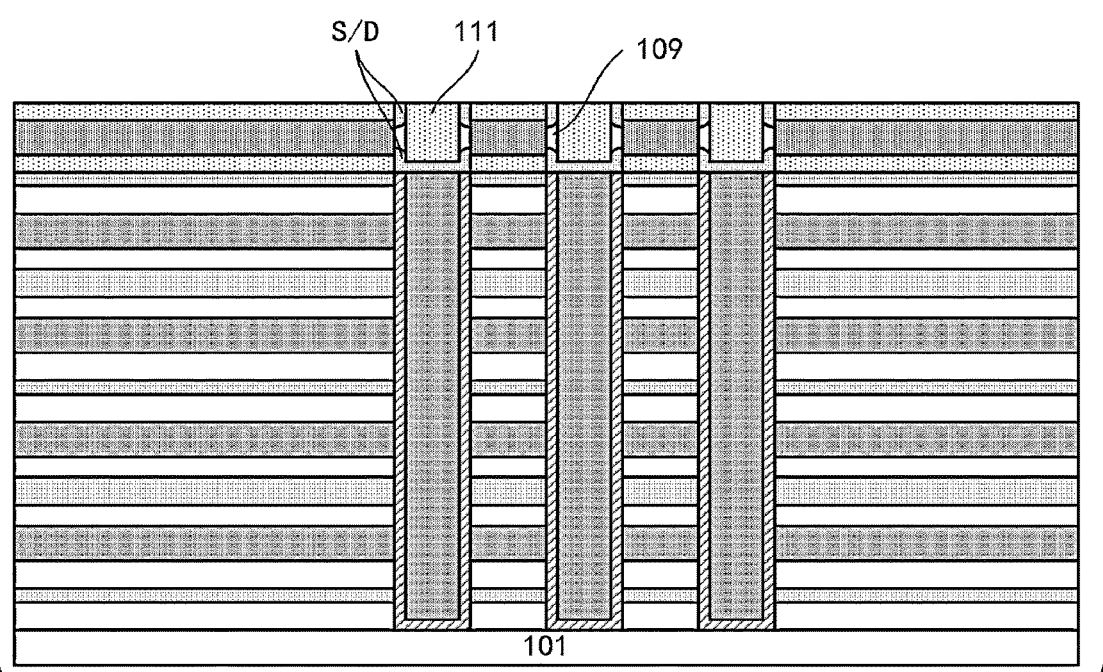

For example, as shown in FIG. 5, the gate stack (125/127) may be etched back/recessed by a certain height through selective etching such as RIE. A height of a top surface of the gate stack after back etching/recess may cause (at least a part of) the first sub-layer $115_1$ of the hard mask layer to be exposed on a sidewall of the gate hole T, while the top source/drain layer $103_3$ will not be exposed on the sidewall of the gate hole T and is still covered by the gate stack. For example, the height of the top surface of the gate stack after back etching/recess may be between a top surface and a bottom surface of the first sub-layer $115_1$ of the hard mask layer. In a space released due to the back etching/recess of the gate stack in the gate hole T, an active layer 109 may be formed by deposition in a substantially conformal manner. Accordingly, the active layer 109 may have a cup shape, including a bottom portion extending on the top surface of the gate stack and a side portion extending on the sidewall of the gate hole T (a portion of the active layer 109 outside the gate hole T may be removed by the subsequent process).

The active layer 109 may include a semiconductor material such as (polycrystalline) Si to define an active region of the select transistor, and a thickness of the active layer 109 is about 5 nm to 20 nm, for example. The dopant may be driven from the first sub-layer $115_1$ and the third sub-layer $115_3$ that act as the solid phase dopant sources into the active layer 109 by annealing, for example, a peak annealing or rapid heat processing (RTP) for about 0.5 seconds to 2 seconds at about 700° C. to 1050° C., so as to form a source/drain region S/D of the select transistor in regions of the active layer 109 which correspond to the first sub-layer $115_1$ and the third sub-layer $115_3$. Here, a condition of an annealing process may be controlled so that the dopant diffused from the solid phase dopant sources will not substantially affect the middle portion (a region corresponding to the second sub-layer $115_2$) of the active layer 109 in the vertical direction.

In addition, in order to reduce the contact resistance, a bottom portion of the active layer 109 may be doped (the doping type is the same as the source/drain S/D, and the doping concentration is about $1E19$ $cm^{-3}$ to $1E21$ $cm^{-3}$, for example) by an ion implantation in the vertical direction.

According to an embodiment of the present disclosure, the ion implantation may be performed before the above-mentioned annealing process, so that the implanted dopant may be activated by the above-mentioned annealing process without annealing separately for the ion implantation.

Accordingly, the active region of the select transistor is defined above each string of memory cells. The active region of the select transistor may include source/drain regions formed at upper and lower ends of the active layer 109 (in the vertical direction) and a channel region between the source/drain regions (in the middle of the vertical direction). The source/drain region at the lower end of the select transistor is electrically connected to the gate conductor layer 127 of the memory cell (through a highly doped region at the bottom portion of the active layer 109).

In a gap obtained after forming the active layer 109 in the gate hole T, a filling portion 111 may be formed by depositing a dielectric material such as oxide followed by the planarization treatment such as CMP (the portion of the active layer 109 outside the gate hole T may be removed in this planarization treatment).

A gate stack of the select transistor may be fabricated by a self-aligning process. For example, the second sub-layer $115_2$ in the hard mask may be replaced by the gate stack of the select transistor, so that the resulted gate stack may be self-aligned to a channel region of the select transistor.

Currently, the hard mask layer extends continuously around each gate hole. It is desired to expose the second sub-layer $115_2$ so as to replace the second sub-layer $115_2$. In addition, considering the formation of a select line described below, the hard mask layer may be patterned into a series of lines that extend substantially in parallel.

Figure 6A:
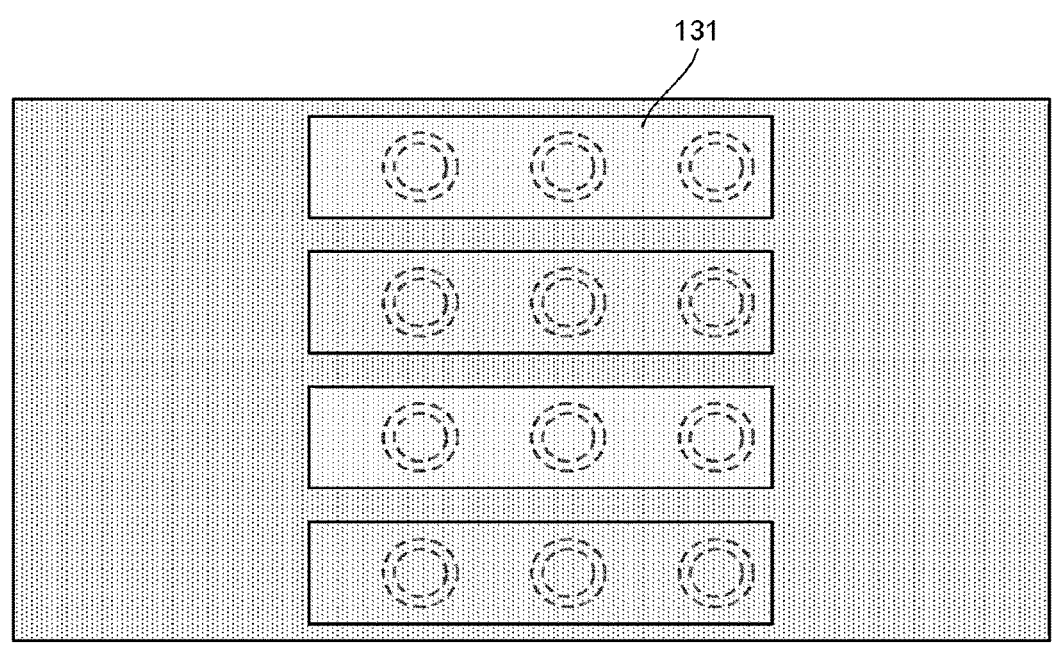
Figure 6B:
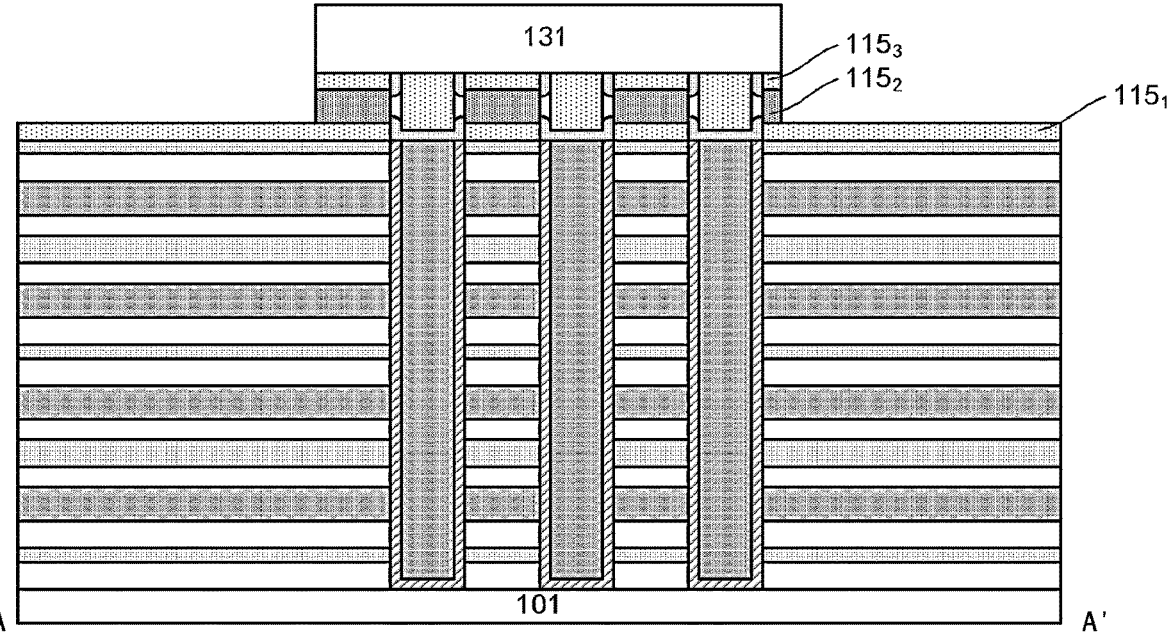
Figure 6C:
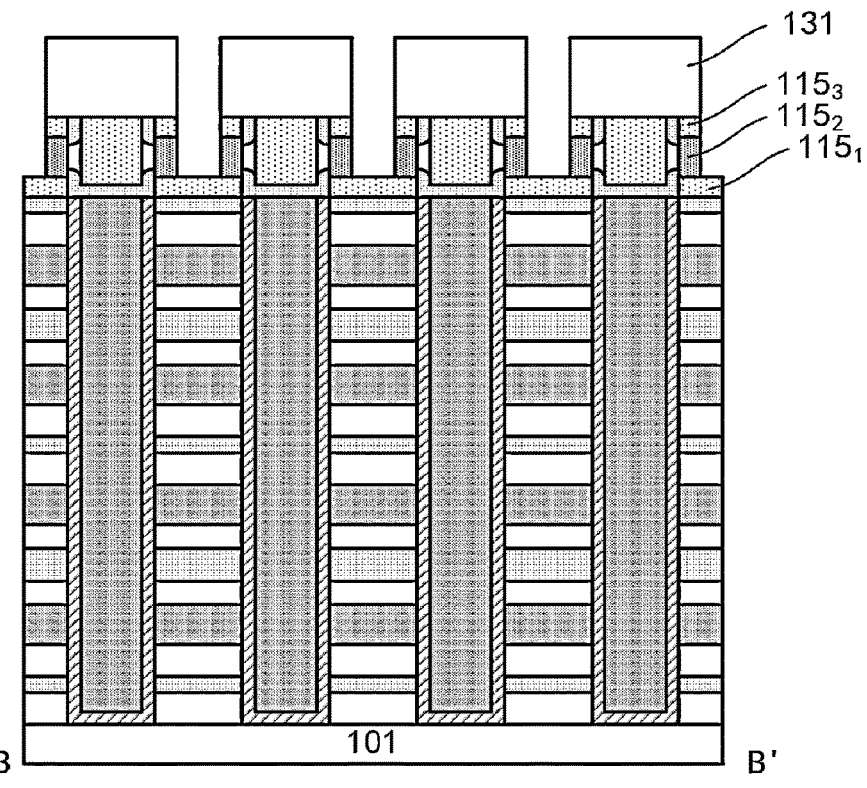

For example, as shown in FIGS. 6(a), 6(b), and 6(c), a photoresist 131 may be formed on the hard mask layer, and the photoresist 131 is patterned into a plurality of linear patterns extending along a first direction (for example, a horizontal direction in paper of FIG. 6(a)) by photolithography. Such linear patterns are spaced from each other in a second direction (for example, a vertical direction in paper of FIG. 6(a)) that intersects (for example, perpendicular to) the first direction, (so as to cover a row of gate holes in the first direction respectively). The third sub-layer $115_3$ and the second sub-layer $115_2$ of the hard mask layer may be etched successively through selectively etching such as RIE, by using the photoresist 131 as an etching mask. Here, etching may be stopped at the first sub-layer $115_1$, so as to protect a device layer below the first sub-layer $115_1$ when the gate stack of the select transistor is subsequently formed. In this way, as shown in FIG. 6(a), the third sub-layer $115_3$ and the second sub-layer $115_2$ in the hard mask layer are formed as strips extending in the first direction, surrounding a periphery of (the active layer 109 formed in) the corresponding row of gate holes, and a sidewall of the second sub-layer $115_2$ is exposed. Then, the photoresist 131 may be removed.

Figure 7A:
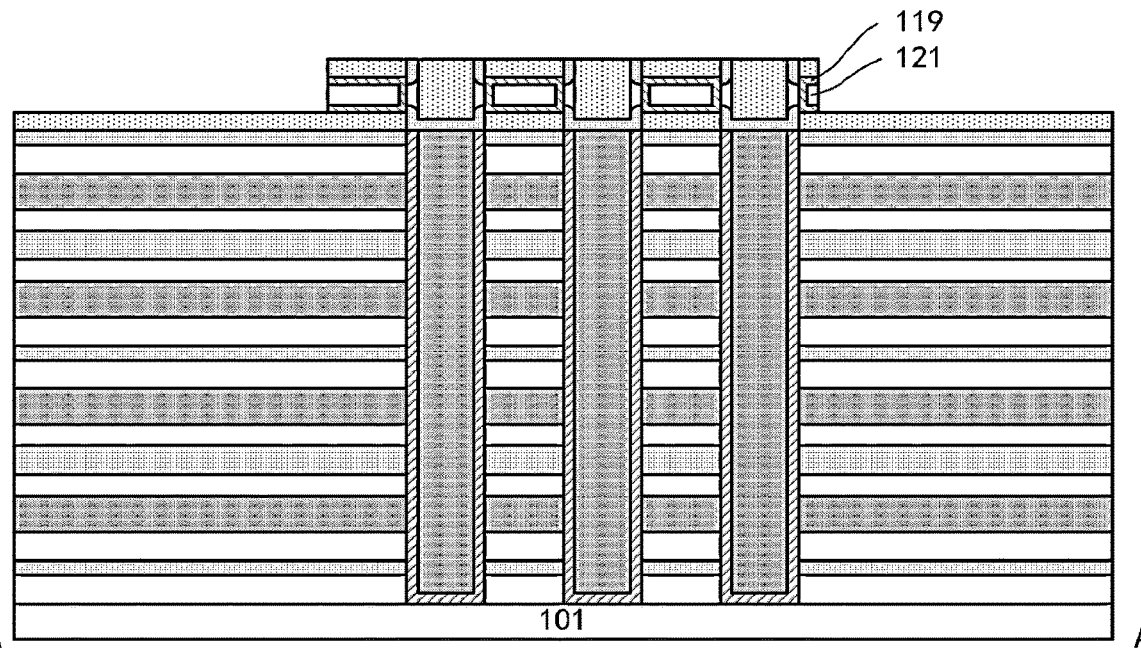
Figure 7B:
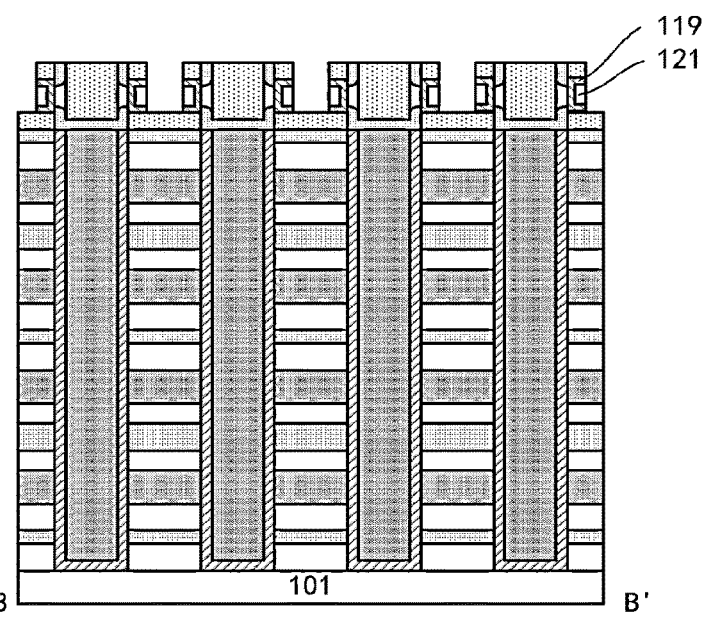
Figure 8A:
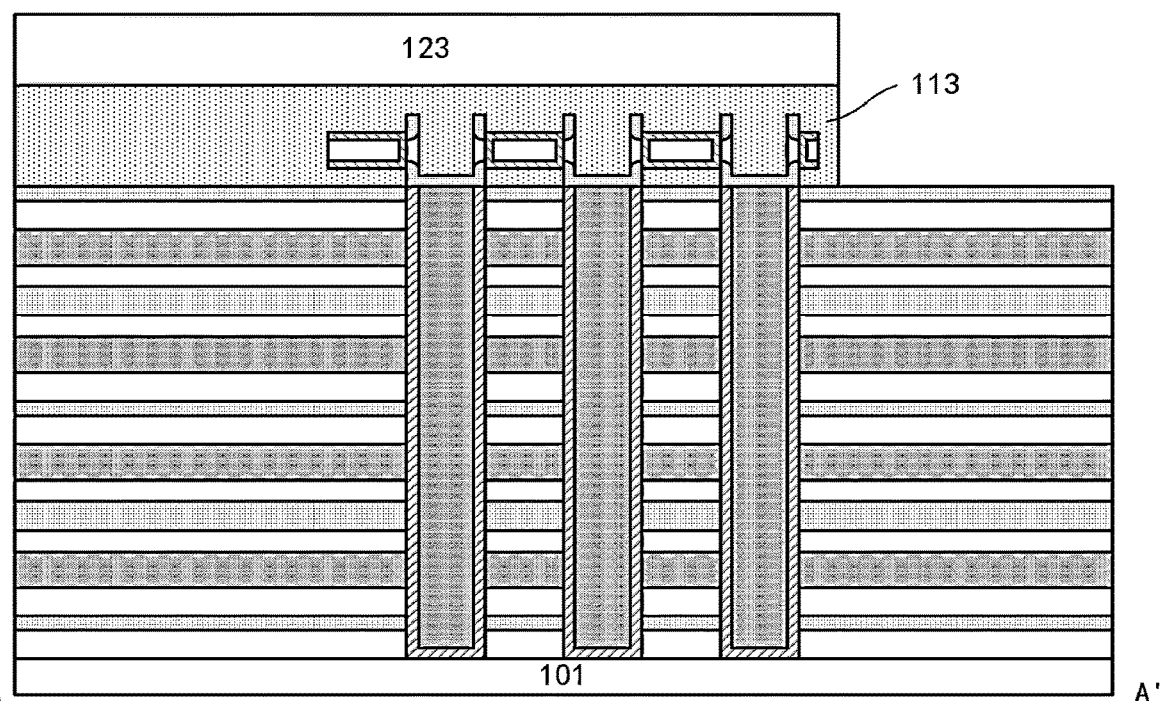
Figure 8B:
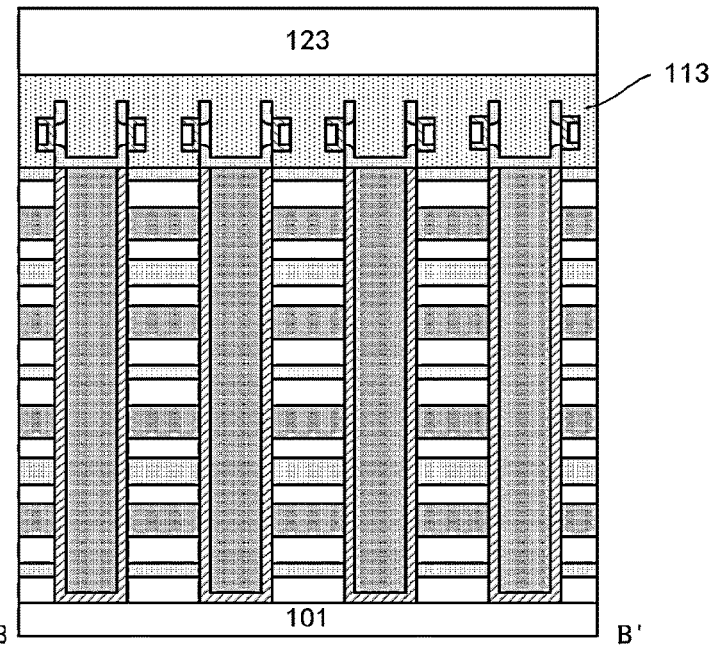

As shown in FIGS. 7(a) and 7(b), the second sub-layer $115_2$ may be removed by selective etching, such as wet etching with hot phosphoric acid, and the gate stack of the select transistor may be formed in a gap left between the first sub-layer $115_1$ and the third sub-layer $115_3$ due to the removal of the second sub-layer $115_2$. For example, a gate dielectric layer 119 and a gate metal layer 121 may be deposited successively, and the deposited gate dielectric layer 119 and the gate metal layer 121 may be etched by using the third sub-layer $115_3$ as a mask. Accordingly, the gate stack (119/121) may be formed into a strip corresponding to a pattern of the photoresist 131 (and a select line may be formed accordingly), and may surround the periphery of the active layer 119 formed in the corresponding row of gate holes. According to an embodiment, the gate dielectric layer 119 may include a high k dielectric such as $HfO_2$, and a thickness of the gate dielectric layer 119 is about 1 nm to 10 nm. The gate metal layer 121 may include a work function adjustment layer such as TiN and a conductive metal layer such as Al or W. An oxide interface layer with a thickness of about 0.5 nm to 2 nm, for example, may further be formed between the gate dielectric layer 119 and the active layer by oxidation or deposition.

So far, the fabrication of the memory cell (string) and the select transistor is basically completed. Then, various electrical contact portions may be fabricated to achieve a desired electrical connection.

In order to achieve an electrical connection to each device layer, a step structure may be formed in the contact region (more specifically, a contact region 2 for BL) on the substrate. Such step structure may be formed in various manners in the art. According to an embodiment of the present disclosure, the step structure may be formed as follows, for example.

As shown in FIGS. 7(a) and 7(b), a top end of the active layer 109 of the select transistor is exposed on a surface of the hard mask layer. In order to protect the active layer 109 when fabricating the step structure as following, another hard mask layer may be formed on the hard mask layer first. In this example, the another hard mask layer may include oxide like the first sub-layer $115_1$, the third sub-layer $115_3$, and the filling portion 111. Accordingly, the another hard mask layer, the first sub-layer $115_1$, the third sub-layer $115_3$ and the filling section 111 are shown as integral in FIGS. 8(a) and 8(b), and are denoted by 113. A photoresist 123 may be formed on the hard mask layer 113, and the photoresist 123 is patterned by photolithography to shield the device region and the contact region 1 used for SL and expose the contact region 2 used for BL. The hard mask layer 113 may be etched to expose the device layer (here, the top source/drain layer $103_3$) through selectively etching such as RIE, by using the photoresist 123 as an etching mask. After that, the photoresist 123 may be removed.

Figure 9:
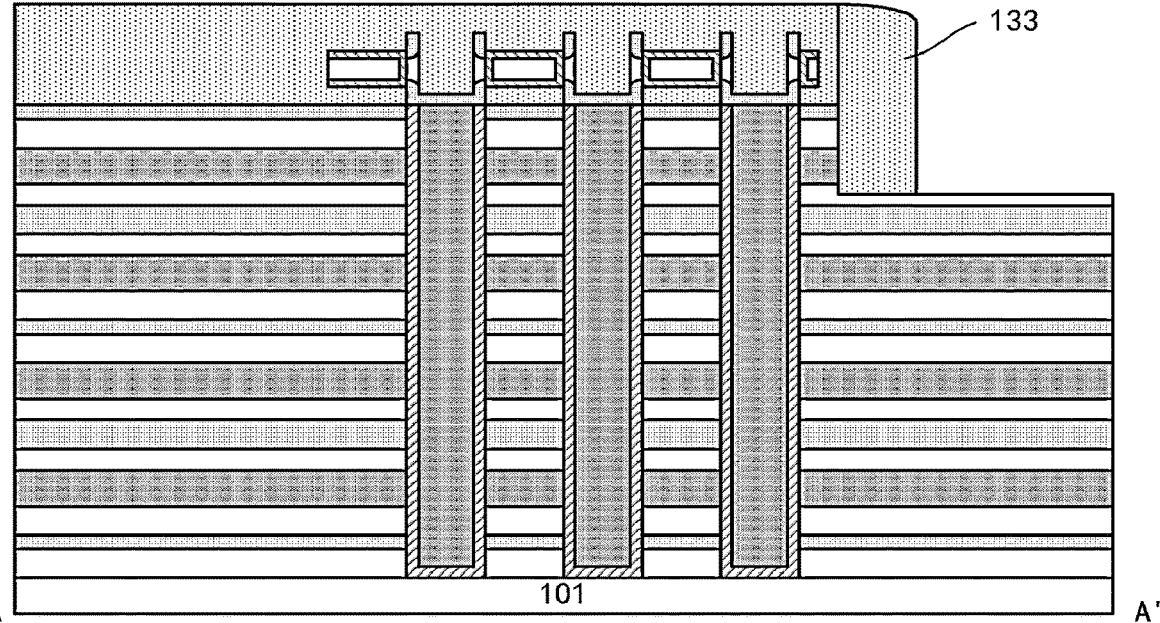

As shown in FIG. 9, selective etching such as RIE may be performed on the source/drain layer $103_3$ and the channel layer $105_4$ by using the formed hard mask layer 113 as an etching mask, so as to expose the source/drain layer $107_2$ electrically connected to BL. The etching may be stopped at an upper portion of the source/drain layer $107_2$, such as the sub-layer $107_{2c}$, by controlling an etching depth. In this way, a step is formed between a surface of the source/drain layer $103_3$ and a surface of the source/drain layer $107_2$ (specifically, the sub-layer $107_{2c}$) in the contact region 2.

A spacer 133 may be formed on the above-mentioned step (and a sidewall of the hard mask layer 113) through a spacer formation process. For example, a layer of dielectric such as oxide may be deposited in a substantially conformal manner, and then anisotropic etching such as RIE in the vertical direction may be performed on the deposited dielectric, so as to remove a transverse extending portion of the deposited dielectric and retain a vertical extending portion of the deposited dielectric, thereby forming the spacer 133. Here, considering that the hard mask layer 113 also includes oxide, an etching depth of the RIE may be controlled to be substantially equal to or slightly greater than a deposition thickness of the dielectric, so as to avoid exposing the action layer 109. A width of the spacer 133 (in the horizontal direction in the figure) may be basically equal to the deposition thickness of the dielectric. The width of the spacer 133 defines a size of a landing pad of a contact portion to the source/drain layer $107_2$.

Figure 10:
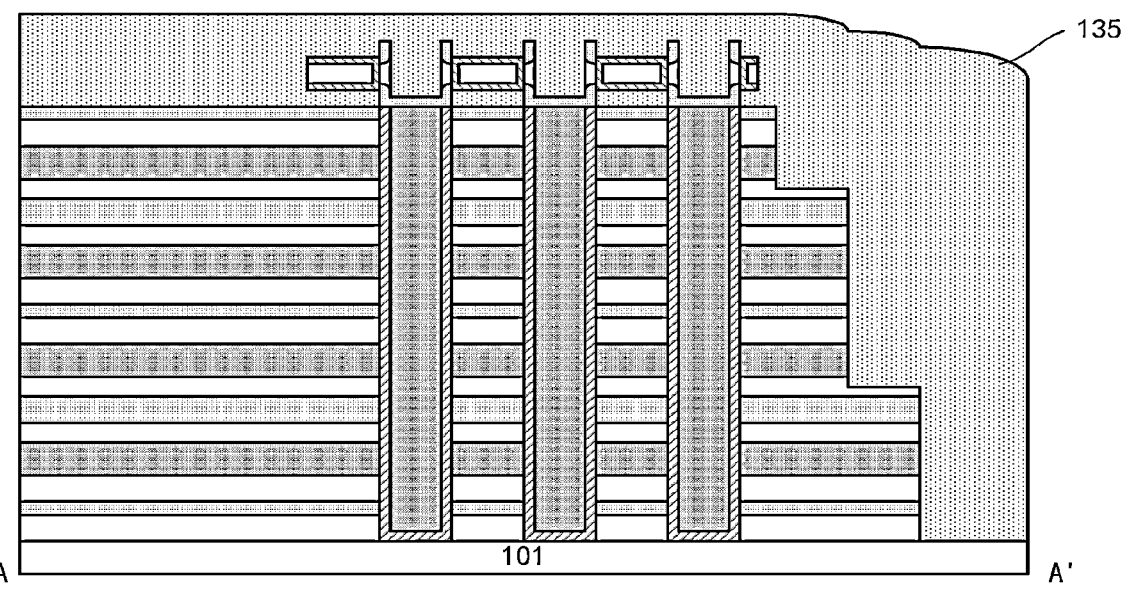

As shown in FIG. 10, selective etching such as RIE may be performed successively on (a remaining portion of) the source/drain layer $107_2$, the channel layer $105_3$, the source/drain layer $103_2$, and the channel layer $105_2$ by using the formed spacer 133 as an etching mask, so as to expose the source/drain layer $107_1$ electrically connected to BL. The etching may be stopped at an upper portion of the source/drain layer $107_1$, such as the sub-layer $107_{1c}$, by controlling an etching depth. In this way, another step is formed in the contact region 2.

According to the process described above in combination with FIGS. 9 and 10, the spacer is formed and etching is performed by taking the spacer as the etching mask. Accordingly, a plurality of steps may be formed in the contact region 2, as shown in FIG. 10. Such steps form such a step structure that each source/drain layer $107_m$ to be electrically connected to BL has an end portion protruded with respect to the upper layer, so as to define a landing pad of a contact portion to the layer. A portion of each formed spacer being left after processing is denoted by 135 in FIG. 10. Since both the spacer 135 and the hard mask layer are oxide, they are shown here as integral (in the following figures, the undulation of the spacer 135 is no longer shown for the sake of illustration). Here, a portion of the substrate 101 is also exposed by the step structure, so as to subsequently fabricate a contact portion to the substrate.

In addition, a common SL contact portion and/or a common bulk contact portion may be fabricated in the contact region 1. The common SL contact portion and the common bulk contact portion may save area compared with a case where an SL contact portion is formed for each source/drain layer $103_n$ and a bulk contact portion is formed for each channel layer. In the following, the SL contact portion and the bulk contact portion are described as an example, so that the concept of the invention may be more comprehensively understood. However, the present disclosure is not limited thereto. For example, it is possible to form the common SL contact portion without forming the common bulk contact portion. The bulk contact portion may be formed for each channel layer by forming more steps (to expose each channel layer) in the contact region 1, for example. Alternatively, it is possible to form the common bulk contact portion without forming the common SL contact portion. The SL contact portion may be formed for each source/drain layer $103_n$ by forming more steps (to expose each source/drain layer $103_n$) in the contact region 1, for example. It is even possible to not form a (common or separated) bulk contact portion.

Figure 11A:
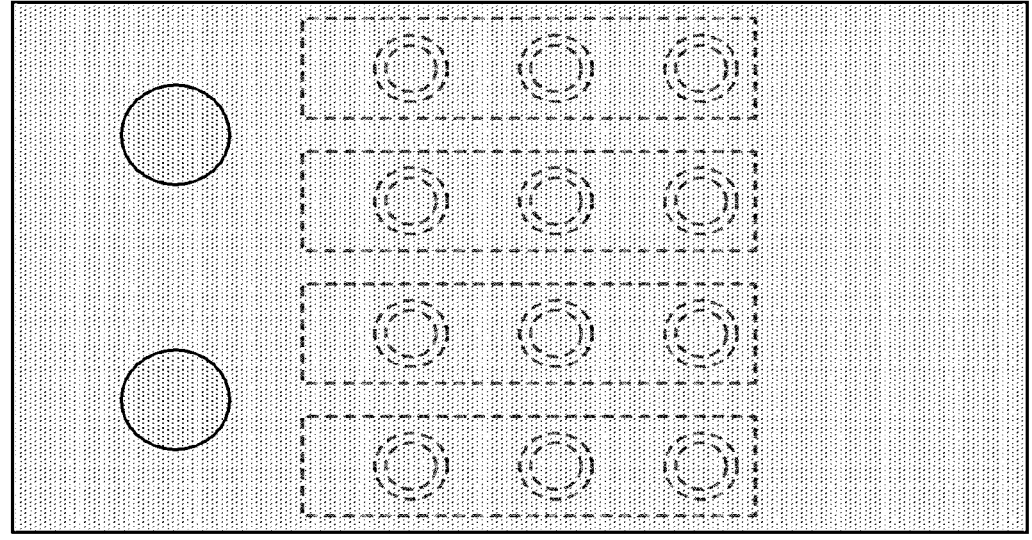
Figure 11B:
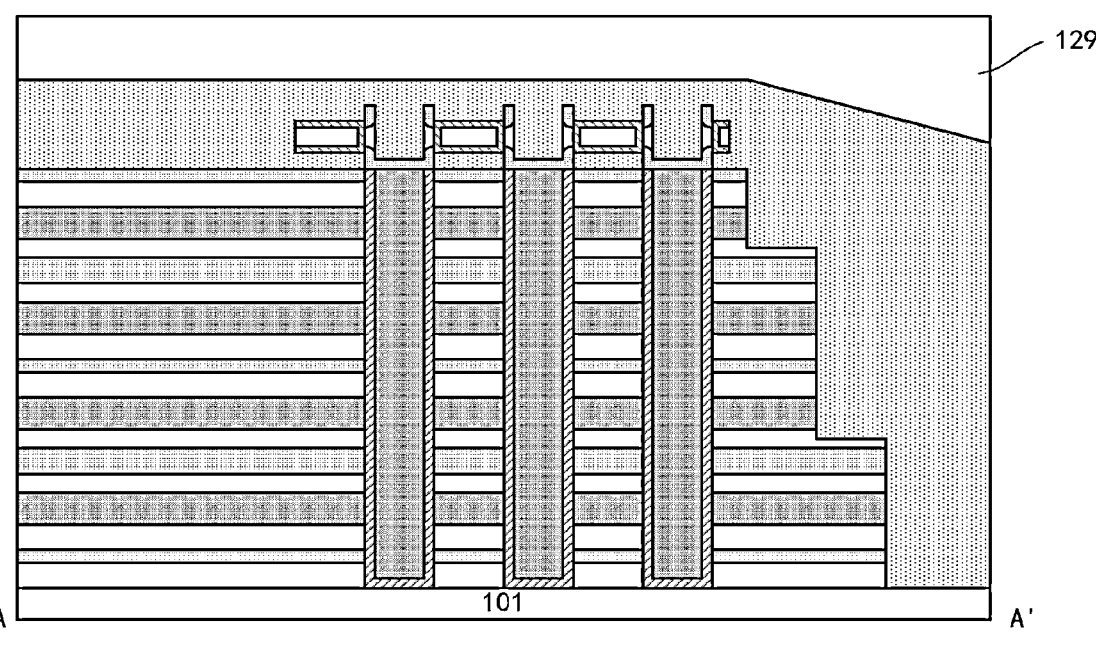
Figure 11C:
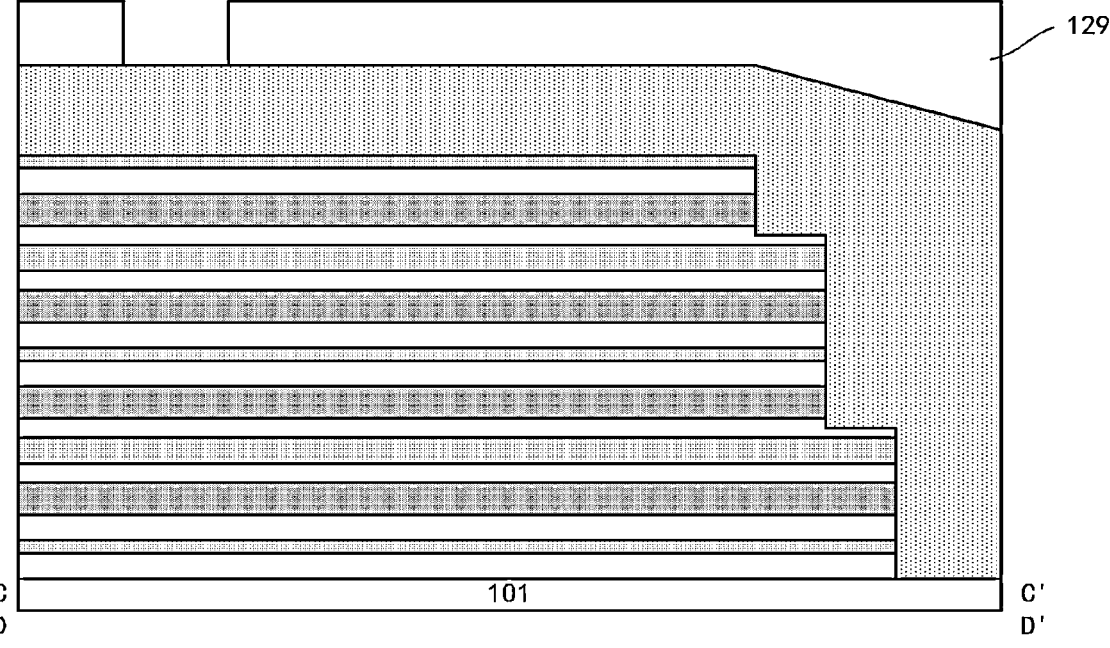

To this end, as shown in FIGS. 11(*a*), 11(*b*), and 11(*c*), a photoresist 129 may be formed, and the photoresist 129 is patterned by photolithography to have an opening (for example, an opening on an upper side of FIG. 11(*a*)) for the bulk contact portion and an opening (for example, an opening on a lower side of FIG. 11(*a*)) for the SL contact portion on the contact region 1. Note that the number of common bulk contact portions (and thus the corresponding openings in the photoresist 129) and common SL contact portions (and thus the corresponding openings in the photoresist 129) may not be limited to one. There may be a plurality of common bulk contact portions and a plurality of common SL contact portions. In this example, these openings may be substantially aligned to positions between the select lines, so as to suppress an interaction between adjacent wirings.

Figure 12:
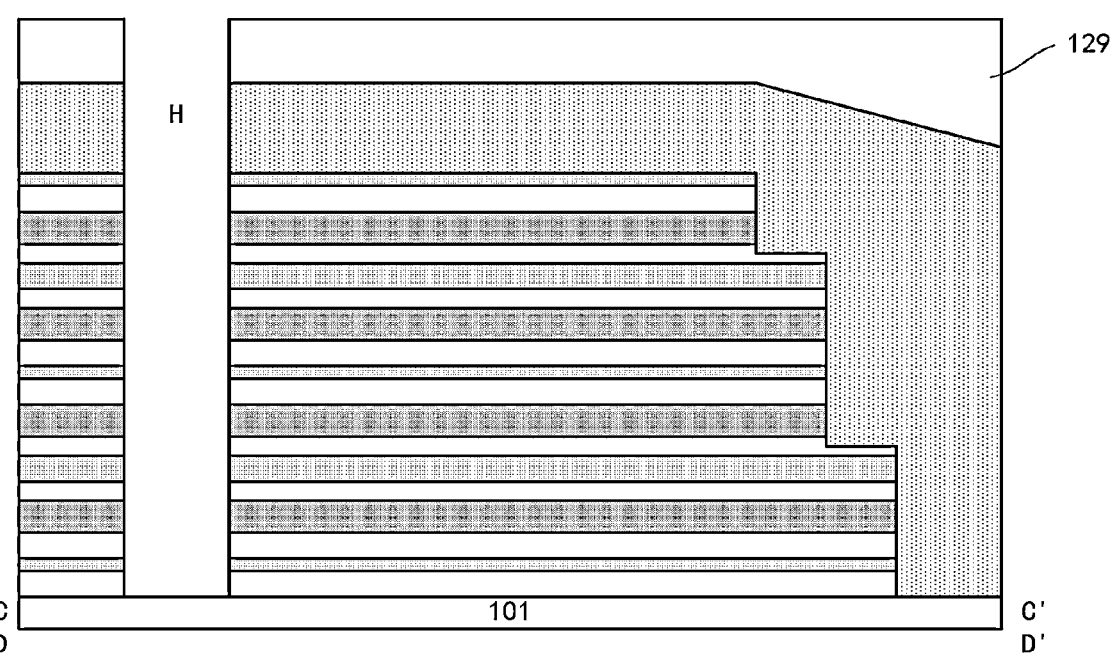

As shown in FIG. 12, the photoresist 129 may be used as an etching mask to etch each layer on the substrate 101 by anisotropic etching, such as RIE, so as to form a contact hole H. RIE may be carried out in a substantially vertical direction and may be performed into the substrate 101. Accordingly, a vertical contact hole H is left on the substrate 101. Then, the photoresist 129 may be removed.

The contact portion may be formed by filling the formed contact hole H with a conductive material such as metal. However, at present, the sidewalls of respective source/drain layers and channel layers are exposed in the contact hole H. In the contact hole used for the SL contact portion, the contact portion should contact with the source/drain layer $107_m$ instead of the source/drain layer $103_n$ (and optionally, the channel layers $105_1$, $105_2$, $105_3$, and $105_4$). Similarly, in the contact hole used for the bulk contact portion, the contact portion should contact with each channel layer $105_1$, $105_2$, $105_3$, and $105_4$ instead of the source/drain layer $103_n$ (and optionally, the source/drain layer $107_m$). According to the embodiment, at least a part of the source/drain layer $107_m$ and at least a part of the channel layer may be electrically connected to the same contact portion.

According to an embodiment of the present disclosure, an etching scheme is provided through the thickness design and etching selectivity of each layer, so that the source/drain layer $103_n$ may be relatively protruded while the source/drain layer $107_m$ (and, optionally, the channel layers $105_1$, $105_2$, $105_3$, and $105_4$) may be relatively recessed in the contact hole used for the SL contact portion; and the channel layers $105_1$, $105_2$, $105_3$, and $105_4$ may be relatively protruded while the source/drain layer $107_m$ (and optionally, the source/drain layer $103_n$) may be relatively recessed in the contact hole for the bulk contact portion.

The contact hole used for the SL contact portion and the contact hole used for the bulk contact portion may be configured differently, so they may be processed separately, for example, processing one of them while shielding the other one. The order of processing the contact hole used for the SL contact portion and processing the contact hole used for the bulk contact portion may be changed.

Figure 13A:
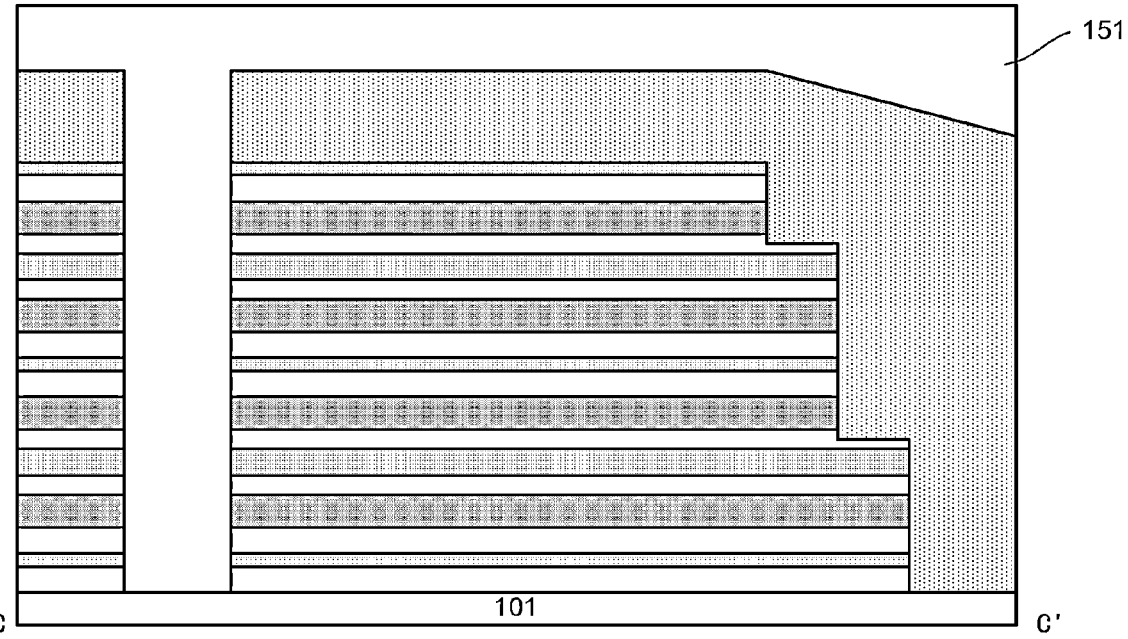
Figure 13B:
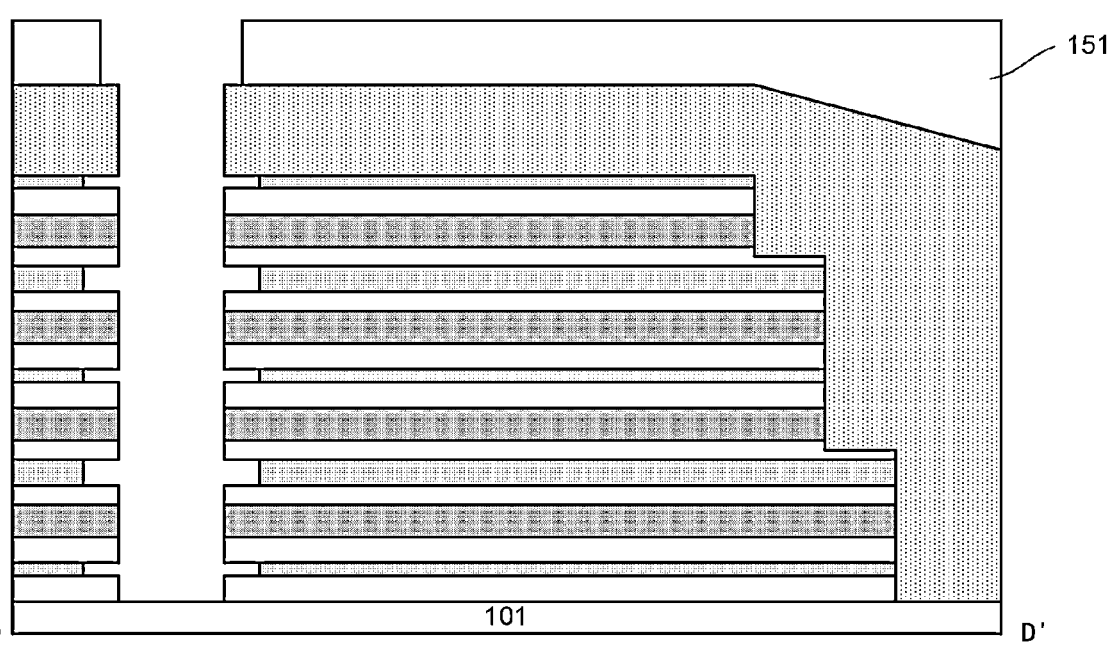

For example, as shown in FIGS. 13(*a*) and 13(*b*), a photoresist 151 may be formed to shield the contact hole used for the bulk contact portion and expose the contact hole used for the SL contact portion. The middle sub-layer $107_{mb}$ (in this example, SiGe) in each source/drain layer $107_m$ may be recessed transversely to a certain depth with respect to other sub-layers in each source/drain layer and channel layers of Si by selective etching via the contact hole used for the SL contact portion (in this example, since the middle sub-layer $103_{nb}$ in each source/drain layer $103_n$ also includes SiGe, the middle sub-layer $103_{nb}$ may also be etched to be recessed transversely). Due to such recess, a transverse channel for the etchant to enter is formed, so that each source/drain layer $107_m$ may be more exposed to the etchant and be more etched, and thus being relatively recessed. This is because the source/drain layer $107_m$ should be electrically connected to a corresponding BL respectively (via a contact portion formed on the step structure in the contact region 1), instead of being electrically connected to the (common) contact portion formed in the contact hole.

Here, a recess depth Dc of each sub-layer $107_{mb}$ may be greater than: (1) a sum of a thickness of a sub-layer $107_{ma}$ adjacent to the sub-layer $107_{mb}$ and a thickness of a channel layer adjacent to the sub-layer $107_{ma}$, (2) a sum of a thickness of a sub-layer $107_{mc}$ adjacent to the sub-layer $107_{mb}$ and a thickness of a channel layer adjacent to the sub-layer $107_{mc}$ (both the sums are generally represented by $(T_{bl}+T_{lg})$.

Next, the photoresist 151 may be removed.

In the contact hole used for the SL contact portion, it is desired that the source/drain layer $103_n$ protrudes with respect to the source/drain layer $107_m$ so as to achieve an electrical connection between the source/drain layer $103_n$ and the SL contact portion formed in the contact hole. However, since the middle sub-layer $103_{nb}$ in the source/drain layer $103_n$ is also recessed as described above, such recess will lead to the transverse channel for the etchant to enter, which will cause the source/drain layer $103_n$ to be more etched subsequently and thus difficult to protrude relatively. To this end, a filling plug may be fabricated at an end portion of the source/drain layer $103_n$, so as to shield such transverse channel at the end portion of the source/drain layer $103_n$ and avoid recess of the source/drain layer $103_n$ due to being over etched.

Figure 14A:
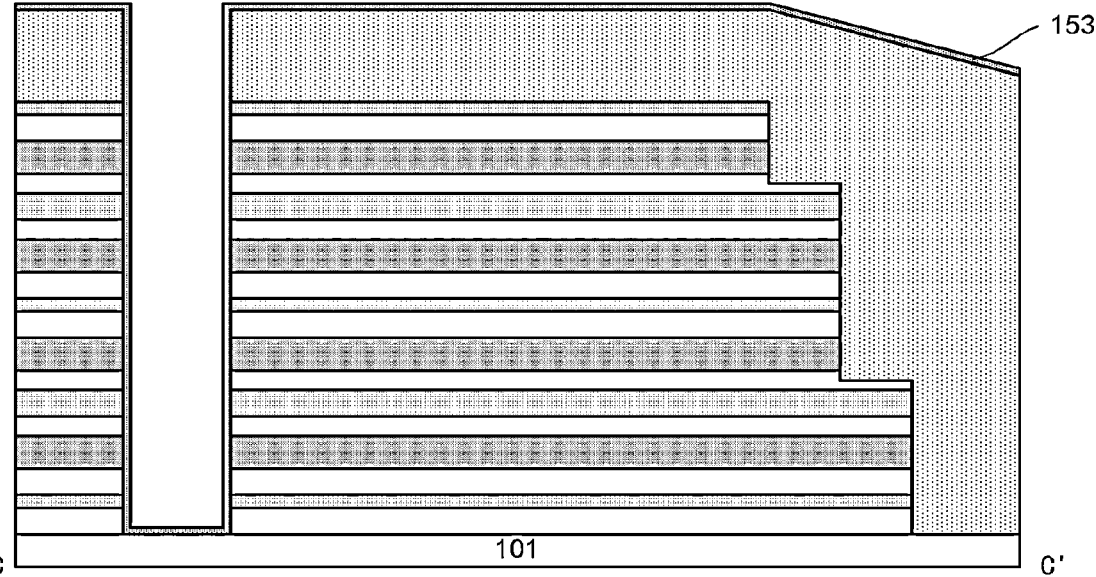
Figure 14B:
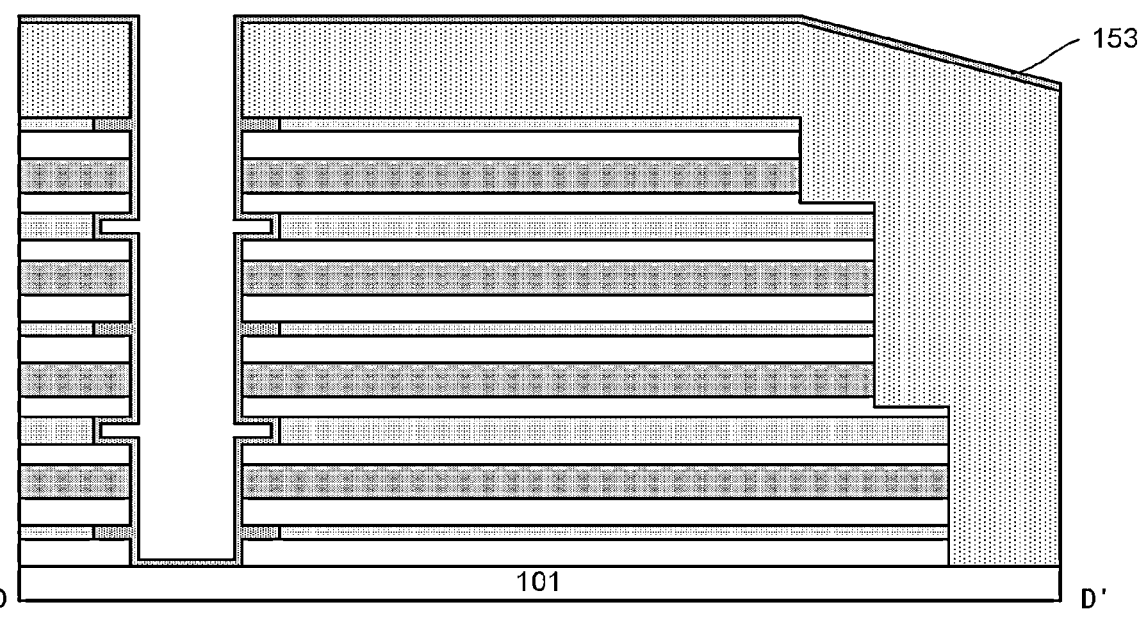

For example, as shown in FIGS. 14(a) and 14(b), a plug material layer 153 may be formed by deposition in a substantially conformal manner. A deposition thickness of the plug material layer 153 may be controlled to be greater than half a thickness of a thinner sub-layer $103_{nb}$, i.e. greater than $T_s/2$, (so that a recess at an end portion of the thinner sub-layer $103_{nb}$ may be completely filled with the plug material layer 153), while less than half a thickness of a thicker sub-layer $107_{mb}$, i.e. less than $T_b/2$ (so that a recess at an end portion of the thicker sub-layer $107_{mb}$ may be kept to be not completely filled with the plug material layer 153). ALD may be used in order to control the deposition thickness well. Considering the etching selectivity, the plug material layer 153 may include, for example, nitride.

Figure 15A:
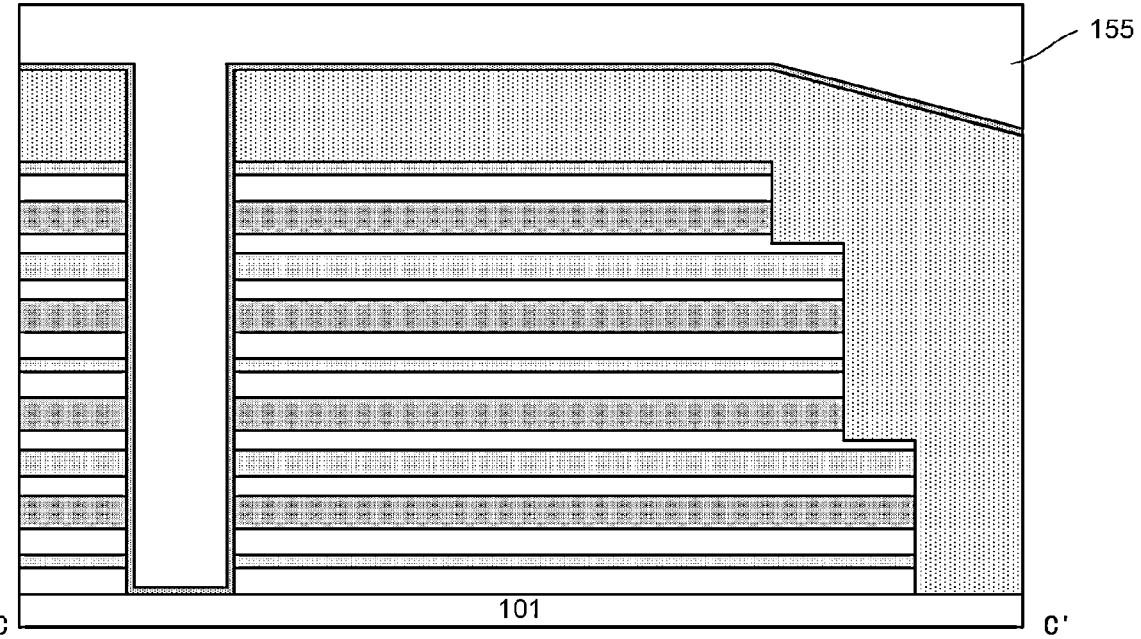
Figure 15B:
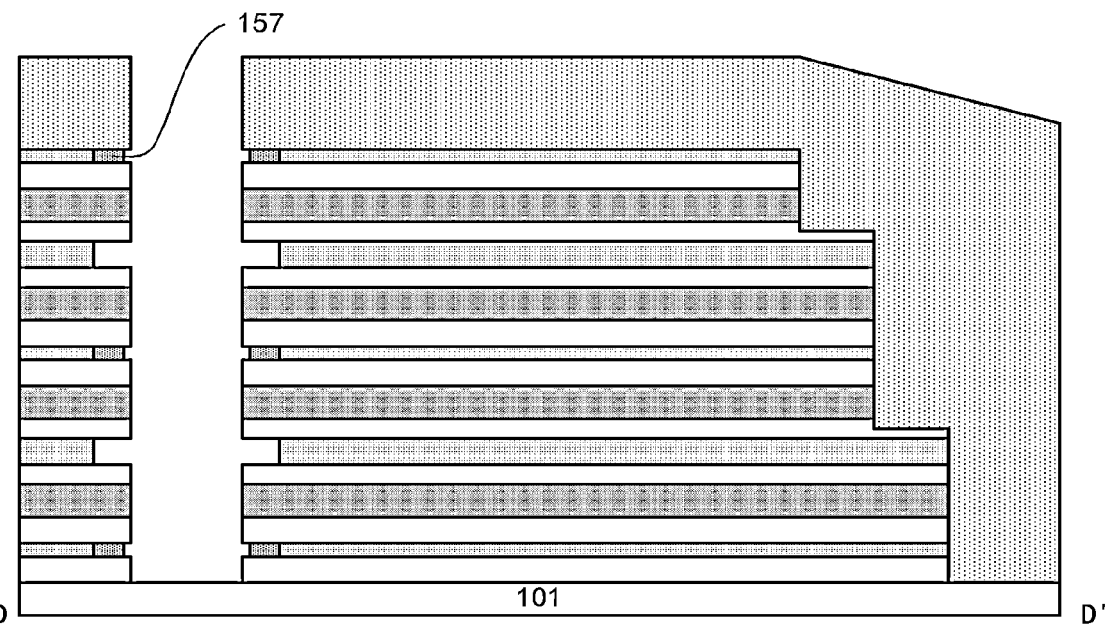

As shown in FIGS. 15(a) and 15(b), a photoresist 155 may be formed to shield the contact hole used for the bulk contact portion and expose the contact hole used for the SL contact portion. For an exposed contact hole used for the SL contact portion, the plug material layer 153 may be removed by a certain thickness through selective etching. For example, a removal thickness of the plug material layer 153 may be basically equal to or slightly greater than the deposition thickness of the plug material layer 153. Accordingly, the plug material layer 153 may be removed from the recess at the end portion of the thicker sub-layer $107_{mb}$ while left in the recess at the end portion of the thinner sub-layer $103_{nb}$, so as to form a filling plug 157. ALE may be used to control the removal thickness well. In the contact hole used for the bulk contact portion, the plug material layer 153 is retained since the plug material layer 153 is shielded by the photoresist 155. Next, the photoresist 155 may be removed.

Although it is advantageous to set $T_s$ to be less than $T_b$ here (because the current flowing through BL is greater than the current flowing through SL as described above), a fabrication of the filling plug 157 does not necessarily require $T_s$ to be less than $T_b$, as long as they are unequal to each other. For example, if $T_s$ is greater than $T_b$, an auxiliary plug may be formed in the recess at the end portion of the sub-layer $107_{mb}$ (rather than in the recess at the end portion of the sub-layer $103_{nb}$) according to the above process. At this time, a filling plug may be additionally formed in the recess at the end portion of the sub-layer $103_{nb}$ by deposition and etching back. A material of the additional formed filling plug may have etching selectivity with respect to a material of the auxiliary plug. Accordingly, by selective etching, the auxiliary plug at the end portion of the sub-layer $107_{mb}$ may be removed and the filling plug at the end portion of the sub-layer $103_{nb}$ may be left.

Figure 16:
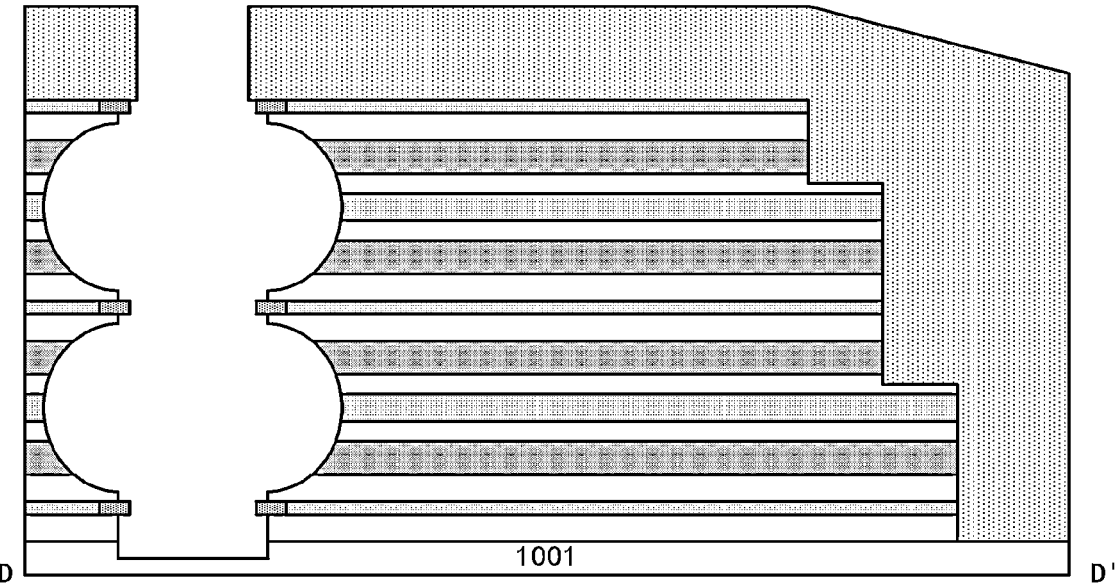

Next, as shown in FIG. 16, a substantially non-selective etching may be performed in the contact hole used for the SL contact portion, for example. Since the sub-layer $107_{mb}$ is relatively recessed, the (sub) layer adjacent to the sub-layer $107_{mb}$ is more exposed to the etchant (which may act on Si and SiGe simultaneously), and thus is etched by relatively large amount. On the other hand, the end portion of the sub-layer $103_n$ is shielded by the filling plug 157 and thus may be substantially not etched, and the adjacent (sub) layer is less exposed to the etchant and thus the amount of etching is relatively small. Accordingly, a shape shown in FIG. 16 may be formed: the source/drain layer $103_n$ is relatively protruded, while the source/drain layer $107_m$ and channel layers $105_1$, $105_2$, $105_3$, and $105_4$ are relatively recessed.

Here, as mentioned above, the recess depth Dc may be greater than $(T_{bl}+T_{lg})$ (so that an etching, which is resulted by the etchant passing through the transverse channel formed by the recess, may be more significant or even dominant), and the etching depth may be greater than $(T_{bl}+T_{lg})$ (meaning that a source/drain sub-layer and channel layer adjacent to the transverse channel may be etched up and down from the transverse channel respectively to cause the source/drain sub-layer and channel layer to be relatively recessed). In this case, the channel layers $105_1$, $105_2$, $105_3$, and $105_4$ are also etched more and relatively recessed, so that the source/drain layer $103_n$ is sufficiently protruded. However, the recess of the channel layer is not necessary because the channel layer may be electrically connected to the same contact portion as the source/drain layer $103_n$ as described above. In this case, the recess depth Dc may be greater than TN and the etching depth may be greater than $T_{bl}$, so that the source/drain layer $107_m$ may be etched more and recessed, while the channel layers $105_1$, $105_2$, $105_3$, and $105_4$ may not be recessed or a recess degree of the channel layers $105_1$, $105_2$, $105_3$, and $105_4$ is not obvious with respect to the source/drain layer $103_n$.

In addition, an original shape may still be maintained in the contact hole used for the bulk contact portion due to the presence of the plug material layer 153.

In fact, if the formation of the bulk contact portion is not considered, at least one of the source/drain layer $103_n$ and the source/drain layer $107_m$ does not have to be formed as a stack structure. For example, the source/drain layer $107_m$ may have etching selectivity with respect to the source/drain layer $103_n$ and the channel layer as a whole, so that the source/drain layer $107_m$ may be selectively etched to be recessed, while the source/drain layer $103_n$ and the channel layer may be substantially unaffected. With such recess of the source/drain layer $107_m$, the source/drain layer $107_m$ (and a channel layer adjacent to the source/drain layer $107_m$ in a case that the etching amount is relatively large) may be more etched to be relatively recessed, so that the source/drain layer $103n$ is relatively protruded. In this case, it is not necessary to form the filling plug as described above. Alternatively, for example, the source/drain layer $103_n$ and the source/drain layer $107_m$ may have etching selectivity with respect to the channel layer, and a thickness of the source/drain layer $103_n$ is different from a thickness of the source/drain layer $107_m$. The source/drain layer $103_n$ and the source/drain layer $107_b$ may be selectively etched to form recesses at end portions of the source/drain layer $103_n$ and the source/drain layer $107_m$, and the filling plug may be formed in the recess at the end portion of the source/drain layer $103_n$ as described above.

Alternatively, for example, the middle sub-layer $103_{nb}$ of the source/drain layer $103_n$ and the middle sub-layer $107_{mb}$ of the source/drain layer $107_m$ may have etching selectivity with respect to each other, so that selective etching of the middle sub-layer $107_{mb}$ of the source/drain layer $107_m$ may be achieved without forming the filling plug as described above.

In short, the design of the source/drain layer may be varied, for example, in terms of thickness, material, stack, etc., as long as (at least a portion of) a sidewall of the source/drain layer $107_m$ may be opened to form a transverse channel for the etchant, so that the source/drain layer $107_m$ may be more etched to be recessed.

In addition, in a case that a plurality of memory cell layers are formed, the contact hole H is relatively deep. In a case that the etchant is introduced from an opening of the contact hole, the etchant may have a concentration distribution in the vertical direction, for example, a concentration of the etchant at a higher position is higher than a concentration of the etchant at a lower position. To this end, at least one e.g. $T_{bl}$ of $T_{bl}$ and $T_{lg}$ may have different values at different heights, e.g. have a larger value at a higher position (while $T_{lg}$ may be substantially unchanged to ensure the consistency between devices). Accordingly, ($T_{bl}+T_{lg}$) may be smaller at the lower position, so as to ensure that the etching depth may be greater than ($T_{bl}+T_{lg}$) at a height of the entire contact hole.

Figure 17A:
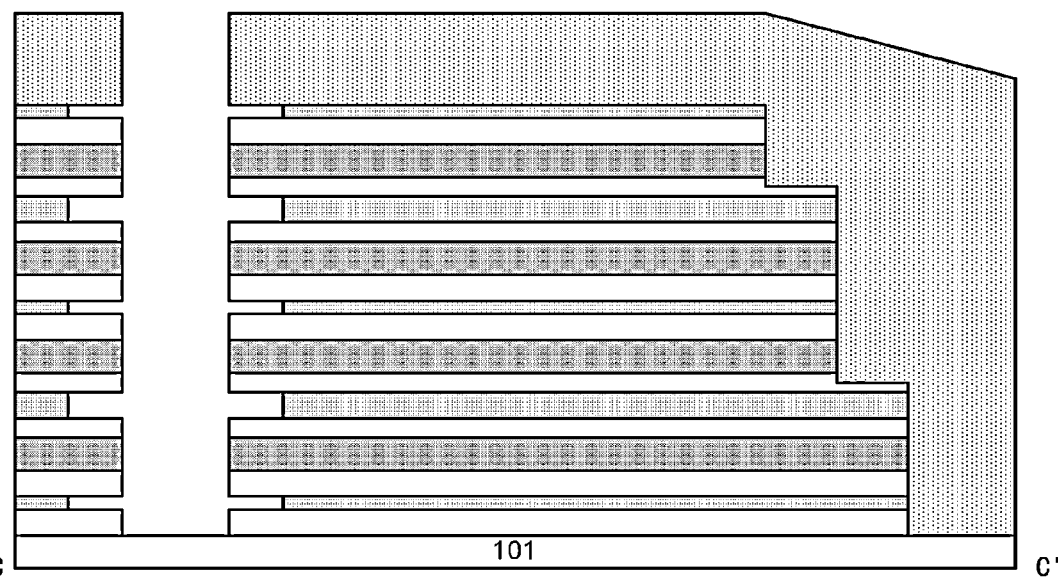
Figure 17B:
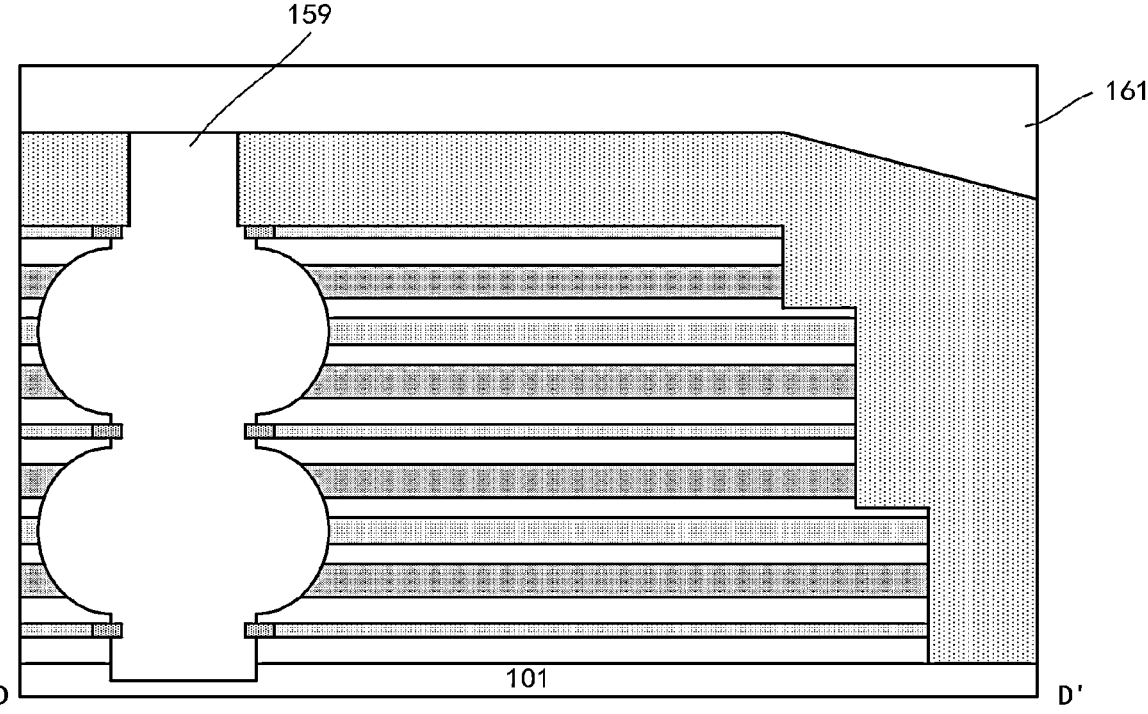

As shown in FIGS. 17(*a*) and 17(*b*), a contact hole used for the SL contact portion with such a configuration may be filled with a dielectric material such as SiC (considering the etching selectivity with respect to, for example, the hard mask layer and the filling plug), so as to form a filling portion 159. Since a thickness of the contact hole used for the SL contact portion changes in the vertical direction, a method of repeated deposition and etching may be used to ensure good filling. Of course, the contact hole used for the bulk contact portion will also be filled with the dielectric material, so as to form a filling portion.

Next, the contact hole used for the bulk contact portion may be similarly processed. To this end, a photoresist 161 may be formed to shield the contact hole used for the SL contact portion (where the filling portion 159 is formed), and expose the contact hole used for the bulk contact portion. The filling portion and the plug material layer 153 in the contact hole used for the bulk contact portion may be removed by selective etching, so that the sidewall of each source/drain layer and channel layer may be exposed in the contact hole. The middle sub-layers $103_{nb}$ and $107_{mb}$ (in this example, SiGe) in each source/drain layer may be recessed transversely to a certain depth with respect to other sub-layers in each source/drain layer and the channel layers (in this example, Si) by selective etching via the contact hole. Here, a recess depth of the middle sub-layers $103_{nb}$ and $107_{mb}$ may be greater than thicknesses ($T_{sl}$) of the sub-layers $103_{na}$ and $103_{nc}$ above and below the middle sub-layer $103_{nb}$ and thicknesses ($T_{bl}$) of the sub-layers $107_{ma}$ and $107_{mc}$ above and below the middle sub-layer $107_{mb}$. Next, the photoresist 161 may be removed.

Figure 18:
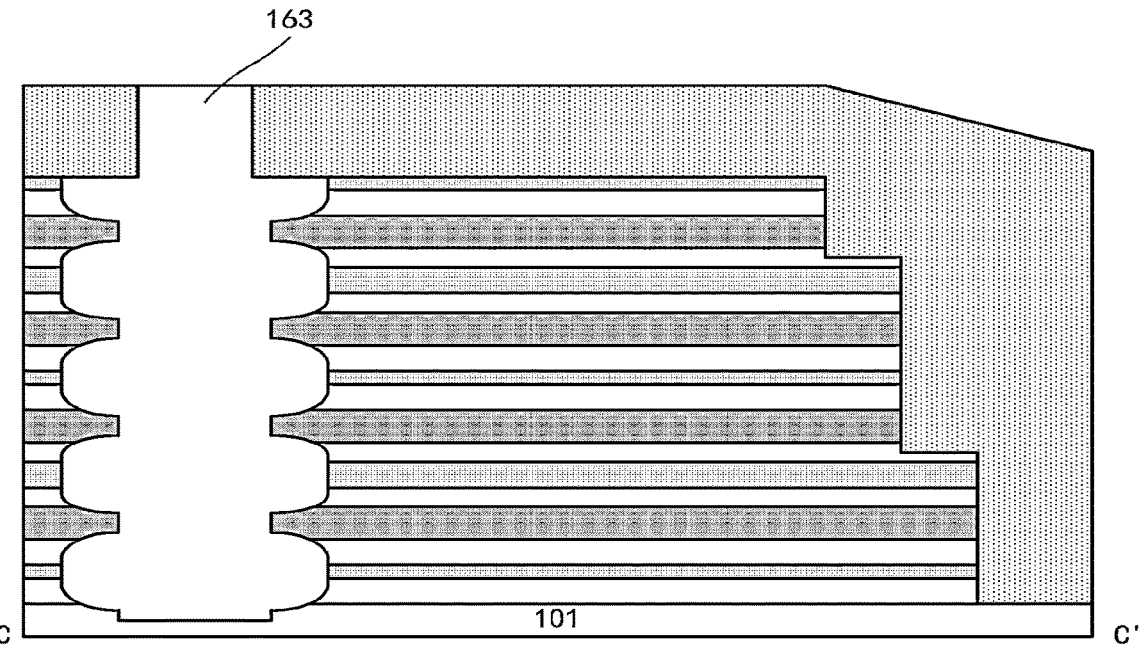

As shown in FIG. 18, a substantially non-selective etching may be performed in the contact hole used for the bulk contact portion, for example. Since the sub-layers $103_{nb}$ and $107_{mb}$ are relatively recessed (and as described above, the recess depth of the sub-layers $103_{nb}$ and $107_{mb}$ may be greater than $T_{bl}$ and $T_{lg}$, so that an etching, which is resulted by the etchant passing through the transverse channel formed by the recess, may be more significant or even dominant), the (sub) layer adjacent to the sub-layers $103_{nb}$ and $107_{mb}$ is more exposed to the etchant, and thus is etched by a relatively large amount. On the other hand, each of the channel layers $105_1$, $105_2$, $105_3$, and $105_4$ is covered by corresponding source/drain layers on upper and lower sides of each of the channel layers $105_1$, $105_2$, $105_3$, and $105_4$, so the channel layers $105_1$, $105_2$, $105_3$, and $105_4$ are less exposed to the etchant and thus is etched by a relatively small amount. Accordingly, a shape shown in FIG. 18 may be formed: the channel layers $105_1$, $105_2$, $105_3$, and $105_4$ are relatively protruded, while the source/drain layers $103_n$ and $107_m$ are relatively recessed. The etching depth may be greater than $T_{bl}$ and $T_{lg}$ (meaning that source/drain sub-layers adjacent to the transverse channel may be etched from the transverse channel upwards and downwards respectively to cause the source/drain sub-layers to be relatively recessed), so that the channel layers $105_1$, $105_2$, $105_3$, and $105_4$ are fully protruded.

As described above, in a case of the contact hole H is relatively deep, considering the concentration distribution of the etchant in the vertical direction, at least one of $T_{bl}$ and $T_{sl}$ may have different values at different heights. For example, at least one of $T_{bl}$ and $T_{sl}$ has a larger value at a higher position, so as to ensure that the etching depth is greater than $T_{bl}$ and $T_{sl}$ at the height of the entire contact hole.

Similarly, a filling portion 163 of dielectric such as SiC may be formed in the contact hole used for the bulk contact portion.

As shown in FIGS. 19(*a*) and 19(*b*), the filling portions 159 and 163 in the contact hole may be etched back by selectively etching such as RIE in the vertical direction. During etching back, the filling portion having a certain thickness is left at the bottom of the contact hole, so as to prevent a contact portion formed subsequently in the contact hole from directly contacting the substrate. Next, the left filling portion and the filling plug (in the contact hole used for the SL contact portion) may be isotropically etched via a space released in the contact hole due to etching back, so that: in the contact hole used for the SL contact portion, the relatively protruded source/drain layer $103_n$ may be exposed from the filling portion 159, while the relatively recessed source/drain layer $107_m$ and the channel layers $105_1$, $105_2$, $105_3$, and $105_4$ are still covered by the filling portion 159; and in the contact hole used for the bulk contact portion, the relatively protruded channel layers $105_1$, $105_2$, $105_3$, and $105_4$ may be exposed from the filling portion 163, while the relatively recessed source/drain layers $103_n$ and $107_m$ are still covered by the filling portion 163. In addition, isotropic etching will not cause the entire filling portion left at the bottom of the contact hole to be etched to expose the substrate 101.

The space released by the above etching in each contact hole may be filled with a conductive material such as metal, so as to respectively form a bulk contact portion 165*a* in contact with the relatively protruded channel layers $105_1$, $105_2$, $105_3$, and $105_4$ in the contact hole used for the bulk contact portion, and a SL contact portion 165*b* in contact with the relatively protruded source/drain layer $103_n$ in the contact hole used for the SL contact portion. A contact region between a protruding portion and a corresponding contact portion is shown in the figure with dotted lines.

In this embodiment, after etching the filling portions 159 and 163, the contact portions 165*a* and 165*b* are formed, so that the source/drain layer $103_n$ and the channel layers $105_1$, $105_2$, $105_3$, and $105_4$ may respectively maintain the relatively protruded shape in the contact hole. However, the present disclosure is not limited thereto. For example, when the filling portions 159 and 163 shield other (sub) layers, the relatively protruded source/drain layers $103_n$ and the channel layers $105_1$, $105_2$, $105_3$, and $105_4$ may be etched back so that they are not protruded or they are even recessed. In this case, the subsequently formed contact portions 165a and 165b may be relatively protruded to be in contact with the corresponding source/drain layers $103_n$ and channel layers $105_1$, $105_2$, $105_3$, and $105_4$.

Next, other contact portions may be fabricated.

Figure 20A:
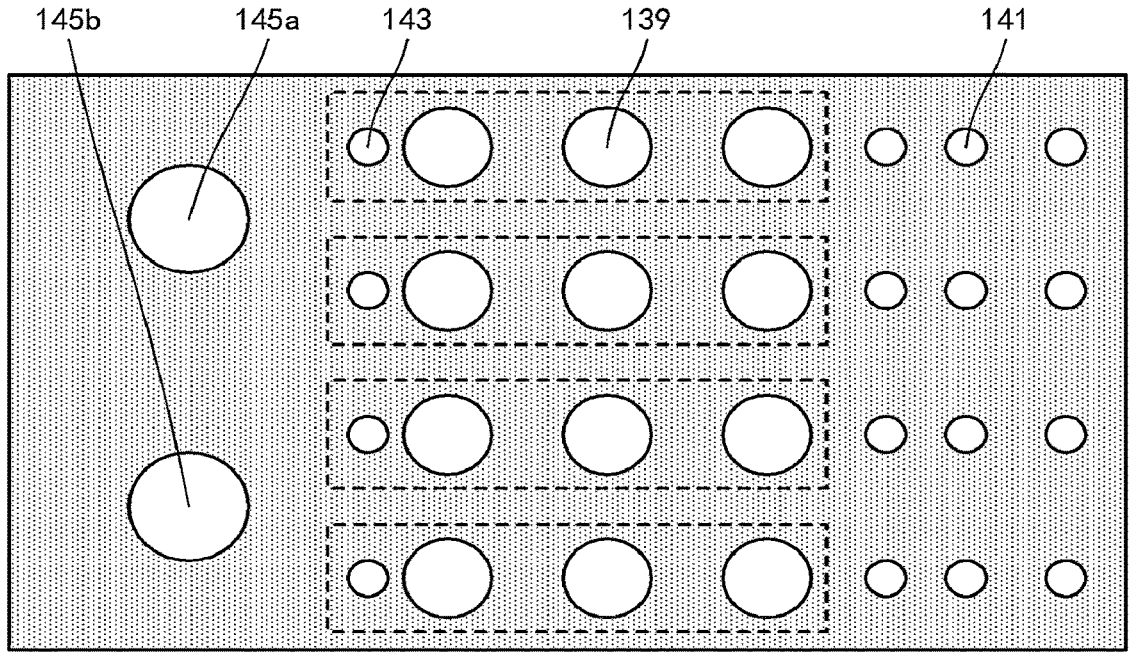
Figure 20B:
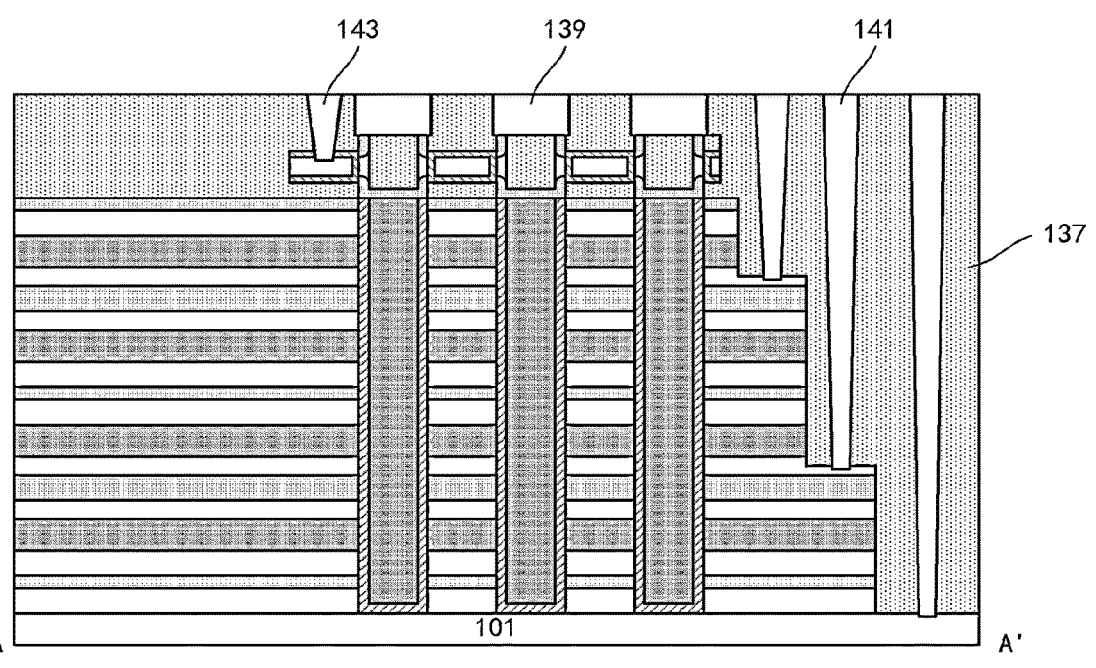

For example, as shown in FIGS. 20(a) and 20(b), an interlayer dielectric layer 137 may be formed by depositing oxide and planarization such as CMP. Here, since the previously formed spacer 135 and the interlayer dielectric layer 137 are oxides, they are shown as integral. Contact portions 139, 141, 143, 145a, and 145b may be formed in the interlayer dielectric layer 137. Specifically, the contact portion 139 is formed in the device region, electrically connected to the select transistor, and electrically connected to the gate conductor layer 127 of the cell composition device via the select transistor. The contact portion 141 is formed in the contact region 2 and electrically connected to each source/drain layer $107_m$. The contact portion 143 is formed in the device region and electrically connected to the gate conductor layer 121 (or a corresponding select line) of the select transistor. The contact portion 145a is formed in the contact region 1 and electrically connected to the bulk contact portion 165a. The contact portion 145b is formed in the contact region 1 and electrically connected to the contact portion 165b. Such contact portions may be formed by etching the interlayer dielectric layer 137 to obtain holes and filling the holes with a conductive material such as a metal.

Here, the contact portion 139 may be electrically connected to the WL. Through WL, a gate control signal may be applied to the gate conductor layer 127 of the cell composition device via the contact portion 139 (and then via the select transistor). The gate control signal may be applied to the gate conductor layer 121 of the select transistor via the contact portion 143, so as to control the applying of a signal from WL to the gate conductor layer 127 of the cell composition device.

The contact portion 141 may be electrically connected to the BL. The contact portion 145a may be electrically connected to a (common) bulk contact BD. The contact portion 145b may be electrically connected to a (common) source line SL. In addition, a contact portion to (a well region in the) the substrate 101 may also be provided.

In this example, one ($103_n$) of the source/drain regions of each cell composition device may be electrically connected to the BL, while the other source/drain region ($107_m$) may be electrically connected to the SL. In this way, an NOR-type configuration may be obtained. Two cell composition devices adjacent to each other in the vertical direction may be connected (in parallel) to the same BL, and thus define a memory cell.

Figure 21:
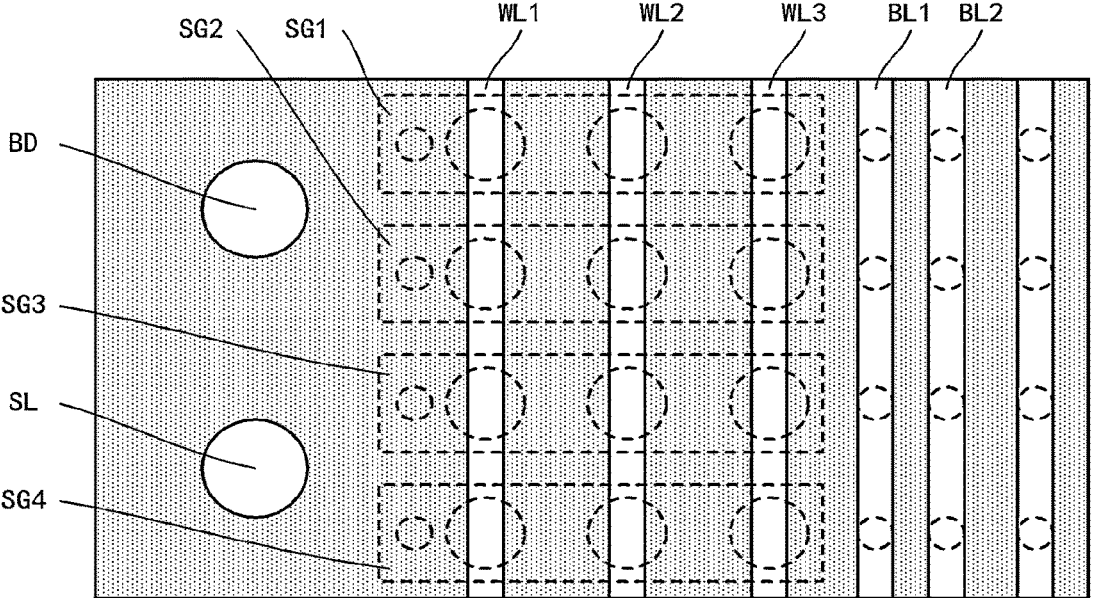

FIG. 21 schematically shows an arrangement of word lines WL1, WL2, and WL3, bit lines BL1 and BL2, the (common) source line SL, the (common) bulk contact BD, and select lines SG1, SG2, SG3, and SG4.

The word lines WL1, WL2, and WL3 may be extended along the second direction to be electrically connected to a column of contact portions 139 in the second direction respectively (and thus the word lines WL1, WL2, and WL3 are electrically connected to a corresponding column of select transistors, and further electrically connected to the gate conductor layer 127 in a corresponding column of gate holes). The bit lines BL1 and BL2 may be extended along the second direction to be electrically connected to source/drain layers $107_2$ and $107_1$, respectively. The source line SL may be electrically connected to the source/drain layers $103_3$, $103_2$, and $103_1$. The bulk contact BD may be electrically connected to each of the channel layers $105_1$, $105_2$, $105_3$, and $105_4$. The select lines SG1, SG2, SG3 and SG4 may be extended along the first direction to surround respective select transistors and serve as gate electrodes of the select transistors.

Figure 22:
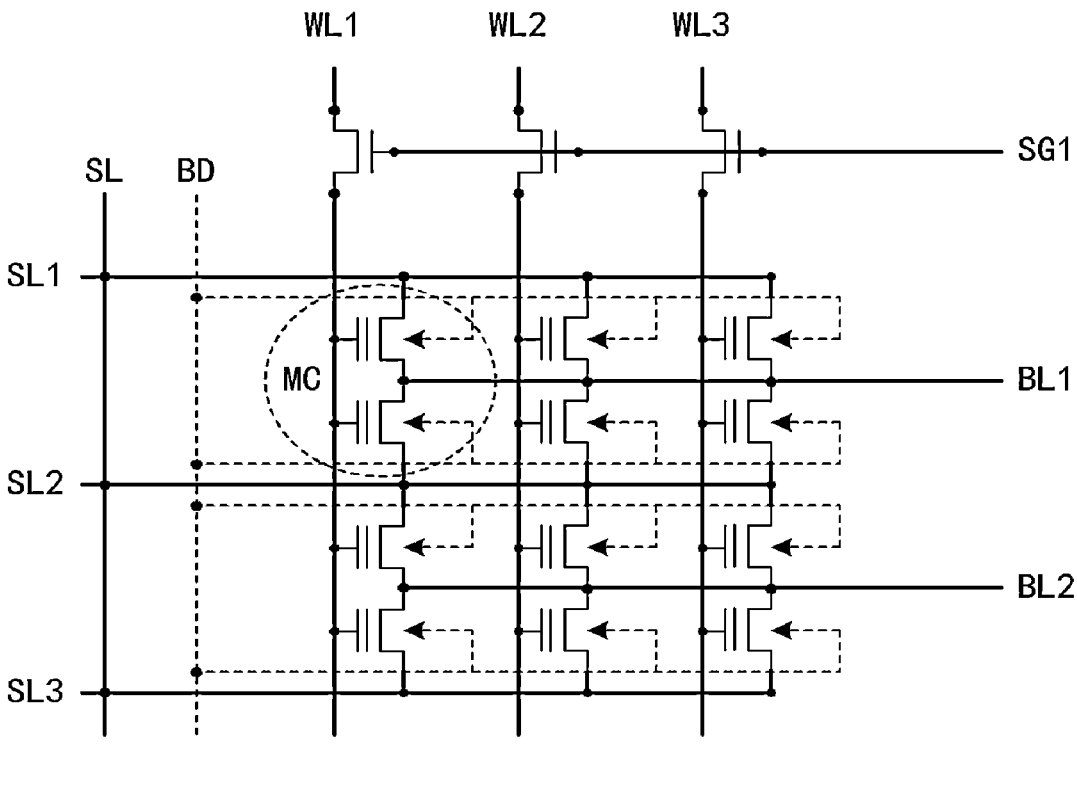
FIG. 22 schematically shows an equivalent circuit diagram of a NOR-type memory device according to an embodiment of the present disclosure, wherein FIGS. 2(*a*), 6(*a*), 11(*a*), 20(*a*), and 21 are top views, and FIG. 2(*a*) shows positions of line AA', line BB', line CC', and line DD'.

FIG. 22 schematically shows an equivalent circuit diagram of a NOR-type memory device according to an embodiment of the present disclosure.

In an example of FIG. 22, three word lines WL1, WL2, and WL3 and two bit lines BL1 and BL2 are schematically shown. However, specific numbers of bit lines and word lines are not limited thereto. A memory cell MC is provided at an intersection of the bit line and the word line. FIG. 22 also shows three source lines SL1, SL2, and SL3. Each source line may be connected to each other, and may be connected to the common source line SL. As described above, a pair of cell composition devices connected to the same bit line and adjacent in the vertical direction form the memory cell MC, and the memory cell MC is connected to corresponding source lines on upper and lower sides of the memory cell MC respectively. The bit lines WL1, WL2, and WL3 are electrically connected to a gate of the cell composition device in the memory cell through a corresponding select transistor. The gate of the select transistor is electrically connected to the select line SG1. In addition, a (optional) bulk connection to each memory cell is schematically shown in FIG. 22 with dotted lines. These bulk connections may have a common bulk contact BD. BD and SL may be electrically connected to each other.

Here, a two-dimensional array of memory cells MC is shown for illustration convenience only. A plurality of such two-dimensional arrays may be arranged in a direction (for example, a direction perpendicular to the paper surface in FIG. 22) of intersection with this two-dimensional array, so as to obtain a three-dimensional array.

In the above embodiment, the common SL contact portion and the common bulk contact portion are described in combination with the embodiment of a memory cell based on a pair of cell composition devices. However, the present disclosure is not limited thereto. The common SL contact portion and the common bulk contact portion and the manufacturing method of the common SL contact portion and the common bulk contact portion according to the embodiment of the present disclosure may also be applied to other configurations, such as a NOR-type memory device in which the memory cell is based on a single cell composition device.

The memory device according to the embodiments of the present disclosure may be applied to various electronic apparatuses. For example, the memory device may store various programs, applications and data required for an operation of the electronic apparatus. The electronic apparatus may further include a processor cooperated with the memory device. For example, the processor may operate the electronic apparatus by running a program stored in the memory device. Such electronic apparatus includes, for example, a smart phone, a personal computer (PC), a tablet, an artificial intelligence device, a wearable device, or a mobile power supply, etc.

In the above description, the technical details such as patterning and etching of each layer are not described in detail. However, those skilled in the art should understand that various technical means may be employed to form a layer, a region or the like having a desired shape. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A NOR-type memory device, comprising:

at least one memory cell layer disposed on a substrate, wherein the at least one memory cell layer comprises a first source/drain layer, a first channel layer, a second source/drain layer, a second channel layer, and a third source/drain layer which are stacked in a vertical direction;

at least one gate stack that extends vertically with respect to the substrate to pass through the at least one memory cell layer, wherein the at least one gate stack comprises a gate conductor layer and a memory functional layer disposed between the gate conductor layer and the at least one memory cell layer, and a memory cell is defined at an intersection of the at least one gate stack and the at least one memory cell layer; and at least one of a source line contact portion and a bulk contact portion, wherein the same source line contact portion extends vertically with respect to the substrate to continuously pass through the at least one memory cell layer, wherein at a position where the source line contact portion is located, the first source/drain layer and the third source/drain layer in the at least one memory cell layer are electrically connected to the source line contact portion respectively, wherein the same bulk contact portion extends vertically with respect to the substrate to continuously pass through the at least one memory cell layer, wherein at a position where the bulk contact portion is located, the first channel layer and the second channel layer in the at least one memory cell layer are electrically connected to the bulk contact portion respectively, and wherein the first channel layer and the second channel layer at different layers surround the same source line contact portion, and the first channel layer and the second channel layer are electrically isolated from the same source line contact portion through an insulating dielectric.

2. The NOR-type memory device according to claim 1, wherein at the position where the source line contact portion is located, the first source/drain layer and the third source/drain layer in the at least one memory cell layer are respectively protruded with respect to the first channel layer, the second channel layer, and the second source/drain layer, so as to be in contact with the source line contact portion.

3. The NOR-type memory device according to claim 1, wherein at the position where the bulk contact portion is located, the first channel layer and the second channel layer in the at least one memory cell layer are respectively protruded with respect to the first source/drain layer, the second source/drain layer, and the third source/drain layer, so as to be in contact with the bulk contact portion.

4. The NOR-type memory device according to claim 1, wherein at the position where the source line contact portion is located, the second source/drain layer in the at least one memory cell layer is electrically isolated from the source line contact portion, and wherein at the position where the bulk contact portion is located, the first source/drain layer, the second source/drain layer, and the third source/drain layer in the at least one memory cell layer are electrically isolated from the bulk contact portion.

5. The NOR-type memory device according to claim 1, wherein the second source/drain layer comprises a stack of a fourth sub-layer, a fifth sub-layer, and a sixth sub-layer, and wherein the fifth sub-layer has etching selectivity with respect to the fourth sub-layer and the sixth sub-layer.

6. The NOR-type memory device according to claim 5, wherein the first source/drain layer comprises a stack of a first sub-layer, a second sub-layer, and a third sub-layer, and the third source/drain layer comprises a stack of a seventh sub-layer, an eighth sub-layer, and a ninth sub-layer, wherein the second sub-layer, the fifth sub-layer, and the eighth sub-layer have etching selectivity with respect to the first sub-layer, the third sub-layer, the fourth sub-layer, the sixth sub-layer, the seventh sub-layer, and the ninth sub-layer, and wherein a thickness of the second sub-layer and a thickness of the eighth sub-layer are unequal to a thickness of the fifth sub-layer.

7. The NOR-type memory device according to claim 6, wherein the thickness of the second sub-layer and the thickness of the eighth sub-layer are less than the thickness of the fifth sub-layer.

8. The NOR-type memory device according to claim 5, wherein a thickness of the fourth sub-layer at a higher height is greater than a thickness of the fourth sub-layer at a lower height, and a thickness of the sixth sub-layer at a higher height is greater than a thickness of the sixth sub-layer at a lower height.

9. The NOR-type memory device according to claim 5, wherein a thickness of the first channel layer at a higher height is greater than a thickness of the first channel layer at a lower height, and a thickness of the second channel layer at a higher height is greater than a thickness of the second channel layer at a lower height.

10. The NOR-type memory device according to claim 6, wherein a thickness of the first sub-layer at a higher height is greater than a thickness of the first sub-layer at a lower height, a thickness of the third sub-layer at a higher height is greater than a thickness of the third sub-layer at a lower height, a thickness of the seventh sub-layer at a higher height is greater than a thickness of the seventh sub-layer at a lower height, and a thickness of the ninth sub-layer at a higher height is greater than a thickness of the ninth sub-layer at a lower height.

11. The NOR-type memory device according to claim 6, wherein each of the first source/drain layer and the third source/drain layer has a dentate sidewall which is adjacent to the source line contact portion and is engaged with the source line contact portion.

12. The NOR-type memory device according to claim 1, wherein the first source/drain layer and the third source/drain layer respectively surround the source line contact portion.

13. The NOR-type memory device according to claim 1, wherein the first channel layer and the second channel layer respectively surround the bulk contact portion.

14. The NOR-type memory device according to claim 1, wherein the source line contact portion is electrically isolated from the substrate at a bottom portion of the source line contact portion through dielectric material, and the bulk contact portion is electrically isolated from the substrate at a bottom portion of the bulk contact portion through dielectric material.

15. The NOR-type memory device according to claim 1, wherein the at least one memory cell layer comprises a plurality of memory cell layers, the first source/drain layer, the first channel layer, the second source/drain layer, the second channel layer, and the third source/drain layer in each memory cell layer are in direct contact with each other, and adjacent memory cell layers are in direct contact with each other.

16. The NOR-type memory device according to claim 1, wherein at least one of the first source/drain layer, the first channel layer, the second source/drain layer, the second channel layer, and the third source/drain layer surrounds one or more of the at least one gate stack in a transverse direction.

17. The NOR-type memory device according to claim 1, further comprising:

at least one select transistor disposed on the at least one gate stack, wherein the at least one select transistor is self-aligned with the at least one gate stack.

18. The NOR-type memory device according to claim 6, wherein the at least one memory cell layer comprises a plurality of memory cell layers, wherein a top memory cell layer comprises a stack of the seventh sub-layer and the eighth sub-layer without the ninth sub-layer.

19. An electronic apparatus comprising the NOR-type memory device according to claim 1.

20. The electronic apparatus according to claim 19, wherein the electronic apparatus comprises a smart phone, a personal computer, a tablet, an artificial intelligence device, a wearable device, or a mobile power supply.

* * * * *